United States Patent
Ka et al.

(10) Patent No.: US 11,367,765 B2
(45) Date of Patent: Jun. 21, 2022

(54) DISPLAY DEVICE

(71) Applicant: SAMSUNG DISPLAY CO., LTD., Yongin-si (KR)

(72) Inventors: Ji-Hyun Ka, Yongin-si (KR); Tae Geun Kim, Yongin-si (KR); Gyeong-Im Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 84 days.

(21) Appl. No.: 16/689,564

(22) Filed: Nov. 20, 2019

(65) Prior Publication Data

US 2020/0161400 A1 May 21, 2020

(30) Foreign Application Priority Data

Nov. 21, 2018 (KR) .................. 10-2018-0144611

(51) Int. Cl.
*H01L 29/04* (2006.01)
*H01L 29/15* (2006.01)
*H01L 31/036* (2006.01)
*H01L 27/32* (2006.01)
*G09G 3/3233* (2016.01)
(Continued)

(52) U.S. Cl.
CPC ....... *H01L 27/3262* (2013.01); *G09G 3/3233* (2013.01); *H01L 27/326* (2013.01); *H01L 27/3265* (2013.01); *H01L 27/3276* (2013.01); *H01L 51/5203* (2013.01); *H01L 51/5206* (2013.01); *G09G 2300/0426* (2013.01); *G09G 2310/02* (2013.01); *G09G 2340/0407* (2013.01); *H01L 27/124* (2013.01); *H01L 27/1214* (2013.01)

(58) Field of Classification Search
CPC ............... H01L 27/3262; H01L 27/326; H01L 27/3265; H01L 27/3276; H01L 27/1214; H01L 27/124; H01L 51/5203; H01L 51/5206; G09G 3/3233; G09G 2300/0426; G09G 2310/02; G09G 2340/0407
USPC .......................................................... 257/72
See application file for complete search history.

(56) References Cited

U.S. PATENT DOCUMENTS 7,495,638 B2  2/2009  Lamvik et al.
9,646,577 B2  5/2017  Deluca
(Continued)

FOREIGN PATENT DOCUMENTS

CN  108807485  11/2018
EP  2 531 006  12/2012
(Continued)

OTHER PUBLICATIONS

Extended European Search Report corresponding to European Application or Patent No. 19210463.6 dated Mar. 30, 2020.

*Primary Examiner* — Calvin Y Choi
(74) *Attorney, Agent, or Firm* — Kile Park Reed & Houtteman PLLC

(57) ABSTRACT

A display device includes a first display area including a plurality of first pixel electrodes, and a second display area including a plurality of second pixel electrodes. A first pitch in a first direction of the plurality of first pixel electrodes is smaller than a second pitch in the first direction of the plurality of second pixel electrodes, and a length in the first direction of the first pixel electrodes is smaller than a length in the first direction of the second pixel electrode.

20 Claims, 23 Drawing Sheets

(51) Int. Cl.
    *H01L 51/52*         (2006.01)
    *H01L 27/12*         (2006.01)

(56) References Cited

U.S. PATENT DOCUMENTS

| | | |
|---|---|---|
| 2003/0128202 A1* | 7/2003 | Kim .............. G09G 3/3283 |
| | | 345/212 |
| 2004/0113875 A1 | 6/2004 | Miller et al. |
| 2004/0227703 A1* | 11/2004 | Lamvik .............. G09G 3/3233 |
| | | 345/76 |
| 2005/0140302 A1 | 6/2005 | Park |
| 2005/0231447 A1 | 10/2005 | Hu et al. |
| 2008/0088561 A1 | 4/2008 | Kawabe |
| 2012/0299033 A1 | 11/2012 | Goda |
| 2016/0043150 A1 | 2/2016 | Wang et al. |
| 2017/0123749 A1 | 5/2017 | Hall |
| 2019/0140025 A1 | 5/2019 | Wang |

FOREIGN PATENT DOCUMENTS

| | | |
|---|---|---|
| KR | 10-2004-0079167 | 9/2004 |
| KR | 10-0646935 B1 | 11/2006 |

* cited by examiner

DISPLAY DEVICE

CROSS-REFERENCE TO RELATED APPLICATION

Korean Patent Application No. 10-2018-0144611, filed on Nov. 21, 2018, in the Korean Intellectual Property Office, and entitled: "Display Device," is incorporated by reference herein in its entirety.

BACKGROUND

1. Field

Embodiments relate to a display device.

2. Description of the Related Art

A display device such as a liquid crystal display (LCD) and an organic light emitting diode (OLED) display includes a display panel including a plurality of pixels displaying an image. Each pixel includes a pixel electrode applied with a data signal, and the pixel electrode is connected to at least one transistor to be applied with the data signal.

The above information disclosed in this Background section is only for enhancement of understanding of the background of the invention and therefore it may contain information that does not form the prior art that is already known in this country to a person of ordinary skill in the art.

SUMMARY

Embodiments are directed to a display device that includes a first display area including a plurality of first pixel electrodes, and a second display area including a plurality of second pixel electrodes. A first pitch in a first direction of the plurality of first pixel electrodes in the first display area may be smaller than a second pitch in the first direction of the plurality of second pixel electrodes in the second display area, and a length in the first direction of the first pixel electrodes in the first display area may be smaller than a length in the first direction of the second pixel electrodes in the second display area.

The display device may further include: a plurality of scan lines, a plurality of data lines for transmitting a data signal, a plurality of driving voltage lines for transmitting a driving voltage, disposed in the first display area and the second display area; a pair of first transistors disposed in the second display area; at least one second transistor connected to the pair of first transistors; and at least one sixth transistor connected to the pair of first transistors and the second pixel electrode.

The pair of first transistors may include a pair of driving gate electrodes, and the pair of driving gate electrodes may be electrically connected to each other.

The pair of driving gate electrodes may be disposed in a same conductive layer as each other and may be separated from each other, and a connecting member disposed in a different conductive layer from the pair of driving gate electrodes may be electrically connected to the pair of driving gate electrodes.

The pair of driving gate electrodes may be disposed in a same conductive layer as each other and may be connected to each other, and a connecting member disposed in a different conductive layer from the pair of driving gate electrodes may be electrically connected to the pair of driving gate electrodes.

A storage line disposed in a different conductive layer from the pair of driving gate electrodes and transmitting the driving voltage may be further included, each of the plurality of scan lines may be extended in a second direction that is different from the first direction, and the storage line may include an expansion overlapping the pair of driving gate electrodes.

The at least one second transistor may be a pair of second transistors respectively connected to the pair of first transistors, the at least one sixth transistor may be a pair of sixth transistors respectively connected to the pair of first transistors, and the second pixel electrode may be connected to the pair of sixth transistors.

A connecting member disposed in a different conductive layer from the pair of driving gate electrodes and connected to one of the pair of driving gate electrodes may be further included, each of the plurality of scan lines may be extended in the first direction, and the pair of second transistors may be respectively connected to two different data lines among the plurality of data lines.

A connecting member disposed in a different conductive layer from the pair of driving gate electrodes and connected to one of the pair of driving gate electrodes may be further included, each of the plurality of scan lines may be extended in the first direction, and one of the pair of second transistors may be connected to one data line among the plurality of data lines and the other may not be connected to any among the plurality of data lines.

A connecting member disposed in a different conductive layer from the pair of driving gate electrodes and connected to the pair of driving gate electrodes may be further included, and each of the plurality of scan lines may be extended in a second direction that is different from the first direction.

The pair of second transistors may be connected to a same data line among the plurality of data lines.

One of the pair of second transistors may be connected to one data line among the plurality of data lines, and the other may not be connected to any among the plurality of data lines.

A plurality of scan lines, a plurality of data lines for transmitting a data signal, and a plurality of driving voltage lines for transmitting a driving voltage, disposed in the first display area and the second display area may be further included, wherein each of the plurality of scan lines may be extended in a second direction that is different from the first direction, the first display area and the second display area may be adjacent to each other in the second direction, and at least a portion among the plurality of scan lines may be bent near a boundary between the first display area and the second display area.

A display device according to an example embodiment includes: a first display area including a plurality of first pixels, and a second display area including a plurality of second pixels; a plurality of data lines for transmitting a data signal; and a plurality of driving voltage lines for transmitting a driving voltage, wherein a first pitch in a first direction of the plurality of first pixels is smaller than a second pitch in the first direction of the plurality of second pixels, and a pixel circuit corresponding to the second pixel includes a light-emitting element, a pair of first transistors including a pair of channel regions, at least one second transistor connected to the pair of first transistors and the data line, and at least one sixth transistor connected to the pair of first transistors and the light-emitting element.

The pair of first transistors may include a pair of driving gate electrodes, and the pair of driving gate electrodes may be electrically connected to each other.

The pair of driving gate electrodes may be disposed in a same conductive layer as each other and may be separated from each other, and a connecting member disposed in a different conductive layer from the pair of driving gate electrodes may be electrically connected to the pair of driving gate electrodes.

The at least one second transistor may be a pair of second transistors respectively connected to the pair of first transistors, at least one sixth transistor may be a pair of sixth transistors respectively connected to the pair of first transistors, and the light-emitting element may be connected to the pair of sixth transistors.

A connecting member disposed in a different conductive layer from the pair of driving gate electrodes and connected to one of the pair of driving gate electrodes may be further included, and each of a plurality of scan lines may be extended in a first direction, while the pair of second transistors may be respectively connected to two different data lines among the plurality of data lines.

A connecting member disposed in a different conductive layer from the pair of driving gate electrodes and connected to the pair of driving gate electrodes may be further included, and each of a plurality of scan lines may be extended in a second direction that is different from the first direction.

A display device according to an example embodiment includes a first display area including a plurality of first pixels, and a second display area including a plurality of second pixels, wherein a first pitch in a first direction of the plurality of first pixel electrodes may be i times a second pitch in the first direction of the plurality of second pixel electrodes, and a length in the first direction of the first pixel electrodes may be j times a length in the first direction of the second pixel electrode, wherein j is smaller than i.

BRIEF DESCRIPTION OF THE DRAWINGS

Features will become apparent to those of skill in the art by describing in detail example embodiments with reference to the attached drawings in which.

DETAILED DESCRIPTION

Figure 1:
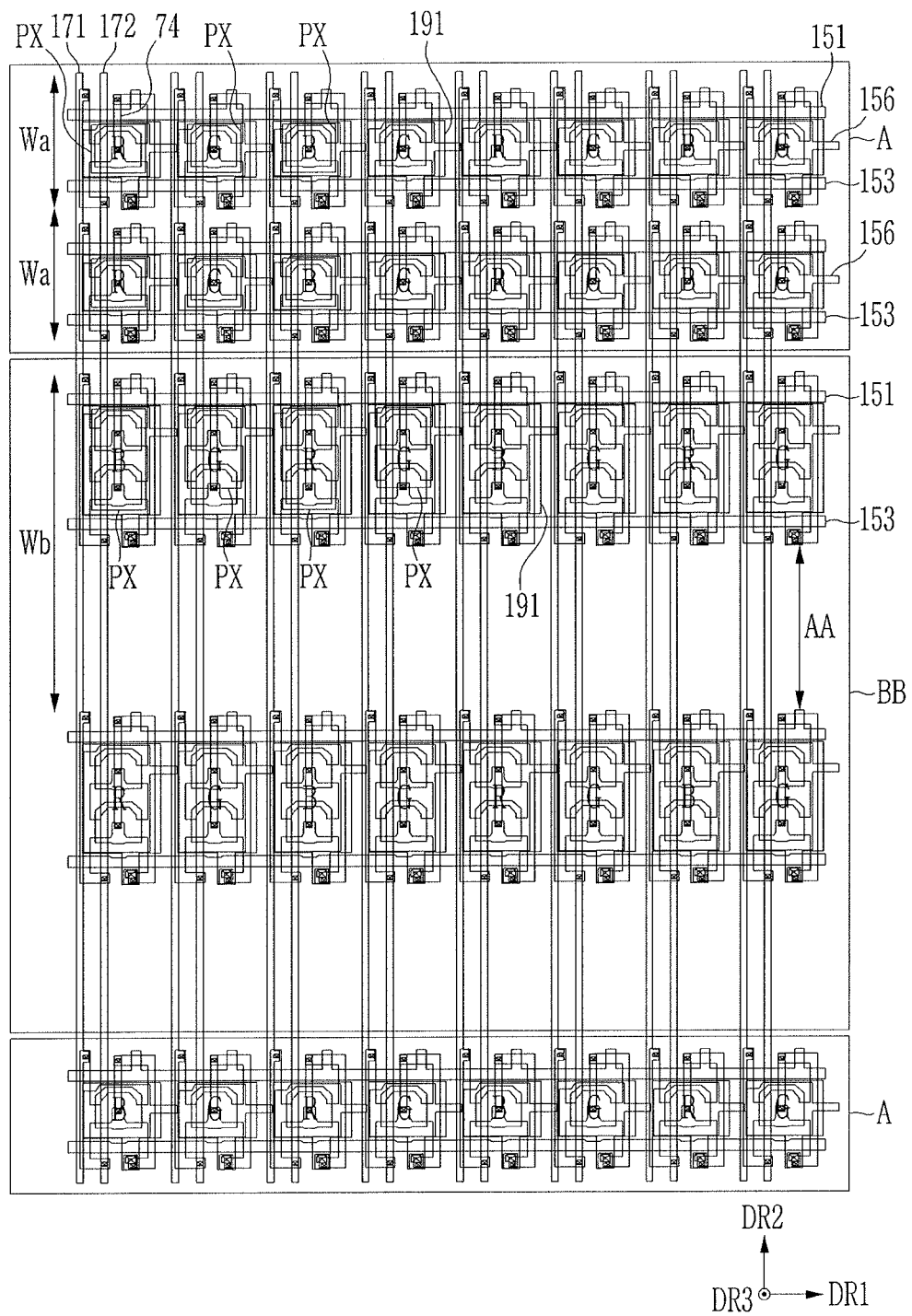
FIG. 1 illustrates a layout view of two display areas of a display device according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Throughout this specification, a plan view means a view when observing a surface parallel to two directions (for example, a first direction DR1 and a second direction DR2) crossing each other, and a cross-sectional view means a view when observing a surface cut in a direction (for example, a third direction) perpendicular to the surface parallel to the first direction DR1 and the second direction DR2. Also, to overlap two constituent elements means that two constituent elements are overlapped in the third direction (for example, a direction perpendicular to an upper surface of the substrate) unless stated otherwise.

First, a display device according to an example embodiment is described with reference to FIG. 1 to FIG. 5.

A display area of a display device according to an example embodiment may include a first display area A and a second display area BB, as a region capable of displaying an image for an input image signal. The first display area A and the second display area BB may be adjacent to each other or separated from each other. FIG. 1 shows an example in which the first display area A and the second display area BB are adjacent to each other.

Each of the first display area A and the second display area BB includes a plurality of pixels PX. The pixel PX is a unit region that represents an image, and can be a region where light may be actually emitted. Each pixel PX may contain a pixel electrode 191 for operation of the pixel PX. Each pixel PX may overlap each corresponding pixel electrode 191.

The pixel PX may contain a plurality of pixels PX that may represent different colors. For example, the color that a pixel PX may represent may be one of three primary colors such as red, green, and blue, or four primary colors, and it may be cyan, magenta, yellow, or white. FIG. 1 shows an example in which each of the first display area A and the second display area BB include a red pixel (R), a green pixel (G), and a blue pixel (B). A plurality of pixels PX representing different colors in the first display area A and the second display area BB may be arranged with a predetermined rule. For example, the order of a red pixel (R), a green pixel (G), a blue pixel (B), and a green pixel (G) may be repeatedly arranged in the first direction DR1.

Referring to FIG. 1, the resolution of the second display area BB may be lower than the resolution of the first display area A.

As the pitch of the pixels PX or the pixel electrodes 191 in a direction is reduced, the resolution in the corresponding direction may be increased. In an example embodiment, a direction that is the basis of the resolution and the pitch may be a diagonal direction intersecting both the first direction DR1 and the second direction DR2, or may be the first direction DR1 or the second direction DR2.

In an example embodiment, the light transmittance of the second display area BB may be higher than the light transmittance of the first display area A. Thus, the second display area BB may be capable of transmitting more light than the first display area A while displaying the image. For example, the display device according to an example embodiment may include a display panel and an optical member such as a camera or a sensor disposed behind the display panel, and the wavelength of light used by the optical member may pass more easily through the second display area BB with higher transmittance than the first display area A.

Referring to FIG. 1, in an example embodiment, the resolution in the second direction DR2 in the second display area BB may be lower than the resolution in the second direction DR2 in the first display area A.

For example, the pitch Wb of the pixel PX or pixel electrode 191 in the second direction DR2 in the second display area BB may be greater than the pitch Wa of the pixel PX or the pixel electrode 191 in the second direction DR2 in the first display area A.

For example, the distance, measured in the second direction DR2, between a first pixel electrode 191 in the second display area BB and a second pixel electrode 191 in the second display area BB may be greater than a distance, measured in the second direction DR2, between a third pixel electrode 191 in the first display area A and a fourth pixel electrode 191 in the first display area A.

For example, a distance, measured in the second direction DR2, between a first signal line 151 extending in the first direction DR1 in the second display area BB and a second signal line 151 extending in the first direction DR1 in the second display area BB may be greater than a distance, measured in the second direction DR2, between a third signal line 151 extending in the first direction DR1 in the first display area A and a fourth signal line 151 extending in the first direction DR1 in the first display area A.

For example, the pitch Wb may be an approximately i times the pitch Wa where i is greater than 1. In an example embodiment, i may be an integer or non-integer value. In an example embodiment, i may be 2.

In an example embodiment, the length in the second direction DR2 of a pixel PX located in the second display area BB may be greater than the length in the second direction DR2 of a pixel PX located in the first display area A.

For example, the length in the second direction DR2 of the pixel PX located in the second display area BB may be j times the length in the second direction DR2 of the pixel PX located in the first display area A, where j is greater than 1. In an example embodiment, j may be an integer or non-integer value. In an example embodiment, j may be about 1.5.

For example, a distance, measured in the second direction DR2, between a first scan line 151 and a first control line 153 for a same first pixel PX in the second display area BB may be greater than a distance, measured in the second direction DR2, between a second scan line 151 and a second control line 153 for a same second pixel PX in the first display area A.

Figure 2:
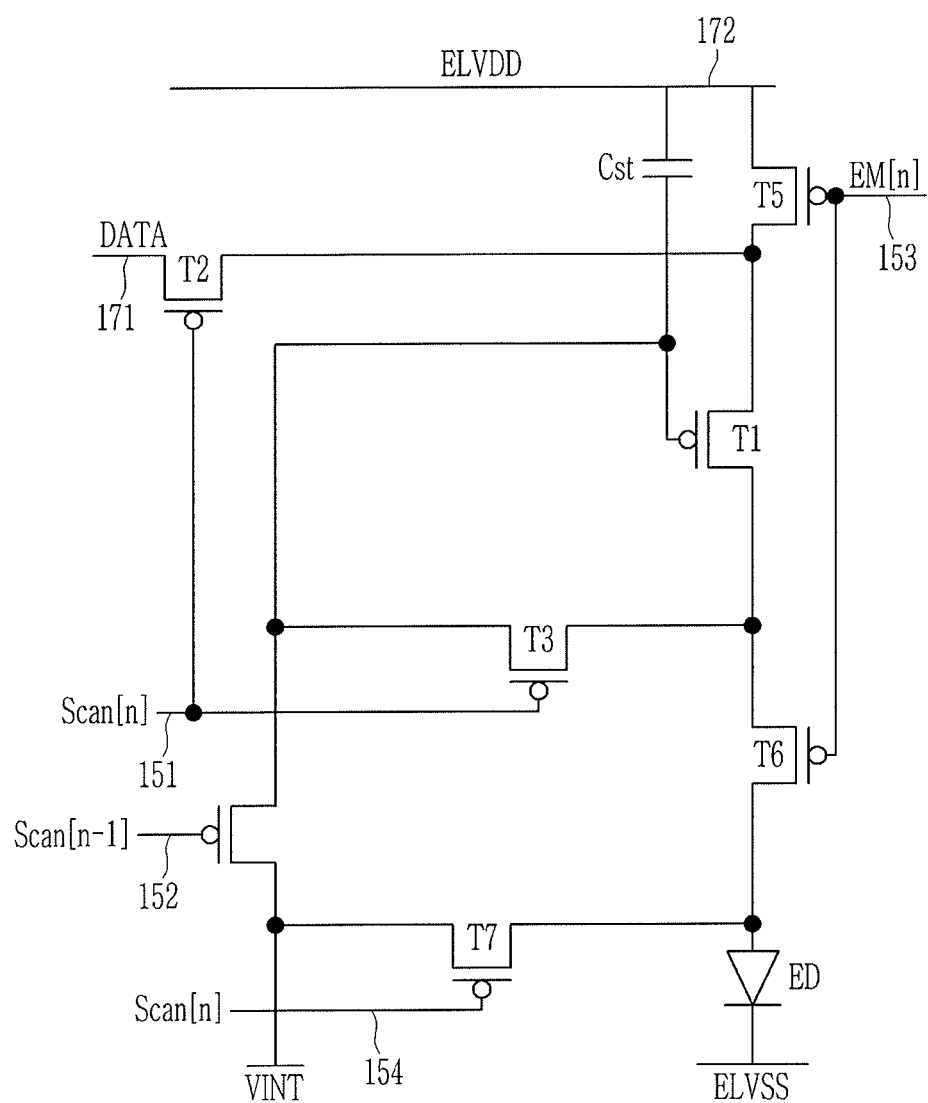
FIG. 2 and FIG. 3 illustrate circuit diagrams of a pixel circuit corresponding to one pixel of a display device according to an example embodiment, respectively.
Figure 3:
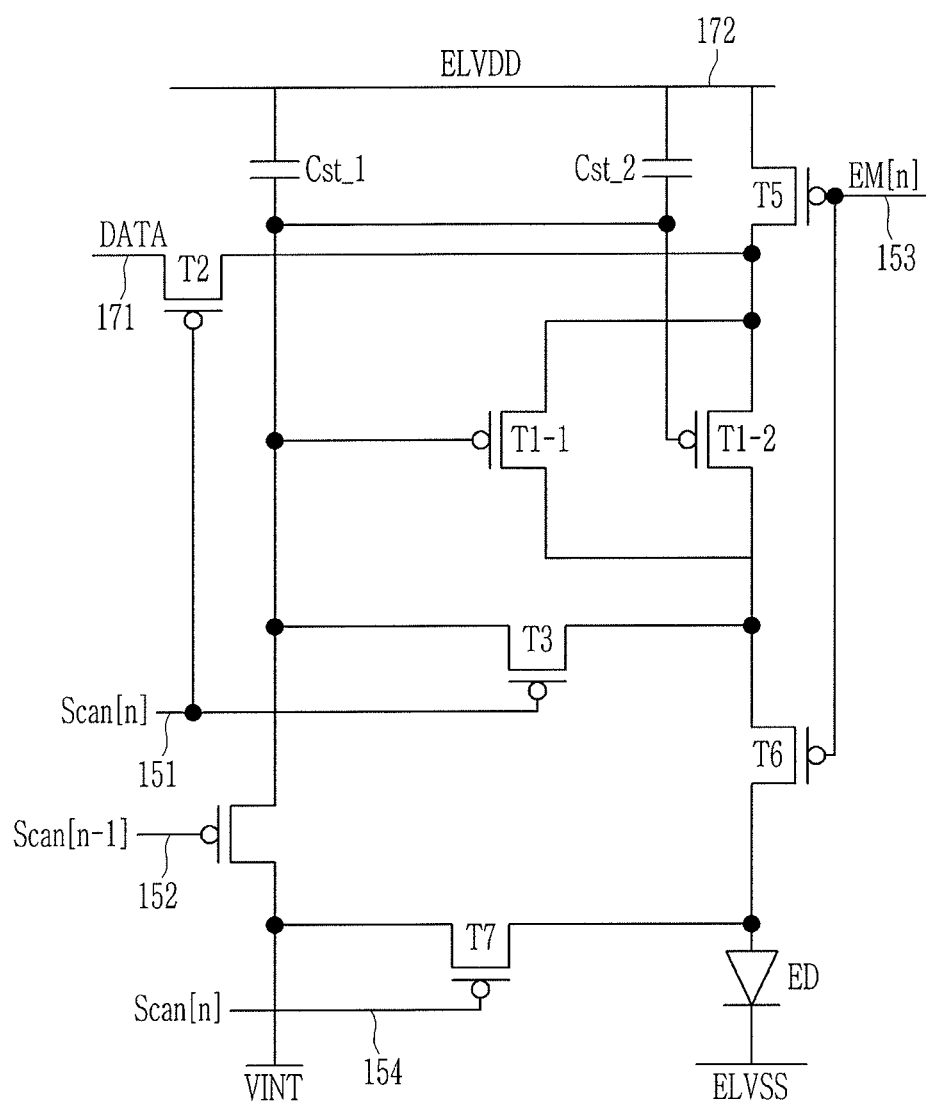

Referring to FIG. 2 and FIG. 3, in the first display area A and the second display area BB, a plurality of signal lines 151, 152, 153, 154, 171, and 172 and a pixel circuit connected thereto may be disposed.

FIG. 2 shows the pixel circuit corresponding to one pixel PX disposed in the first display area A, and FIG. 3 shows the pixel circuit corresponding to one pixel PX disposed in the second display area BB.

Referring to FIG. 2, one pixel circuit disposed in the first display area A may include a plurality of transistors T1, T2, T3, T4, T5, T6, and T7, a capacitor Cst, and at least one light emitting diode (LED) ED, which are connected to the plurality of signal lines 151, 152, 153, 154, 171, and 172. The signal lines 151, 152, 153, 154, 171, and 172 may include a plurality of scan lines 151, 152, and 154, a control line 153, a data line 171, and a driving voltage line 172.

The plurality of scan lines 151, 152, and 154 may transmit scan signals Scan[n] and Scan[n−1]. The scan signals Scan[n] and Scan[n−1] may be a gate-on voltage and a gate-off voltage capable of turning-on/turning-of the transistors T2, T3, T4, and T7. For example, the scan line 151 and the scan line 154 may transmit the scan signal Scan[n], and the scan line 151 may transmit the scan signal Scan[n−1]). The scan line 154 of one pixel circuit (for example, m-th) may transmit the same scan signal as the scan line 152 of the next pixel circuit (for example, [m+1]-th).

The control line 153 may transmit a light emission control signal capable of controlling the emission of the light emitting diode (LED) ED. The light emission control signal may transmit the gate-on voltage and the gate-off voltage.

The data line 171 may transmit the data signal DATA, and the driving voltage line 172 may transmit the driving voltage ELVDD. The data signal DATA may have different voltage levels depending on the image signal input to the display device, and the driving voltage ELVDD may substantially have a constant level.

The plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

A gate electrode of the first transistor T1 may be connected to one terminal of the capacitor Cst, a source electrode of the first transistor T1 may be connected to the driving voltage line 172 via the fifth transistor T5, and a drain electrode of the first transistor T1 may be connected to an anode of the light emitting diode (LED) ED via the sixth transistor T6. The first transistor T1 may receive a data signal DATA transmitted by the data line 171 depending on the switching operation of the second transistor T2 to supply a driving current of the light emitting diode (LED) ED.

The gate electrode of the second transistor T2 may be connected to the scan line 151, the source electrode of the second transistor T2 may be connected to the data line 171, and the drain electrode of the second transistor T2 may be connected to the source electrode of the first transistor T1 via the fifth transistor T5 while being connected to the driving voltage line 172. The second transistor T2 may be turned on depending on the scan signal Scan[n] transmitted through the scan line 151 to transmit the data signal DATA transmitted from the data line 171 to the source electrode of the first transistor T1.

The gate electrode of the third transistor T3 may be connected to the scan line 151, and the source electrode of the third transistor T3 may be connected to the anode of the light emitting diode (LED) ED via the sixth transistor T6 while being connected to the drain electrode of the first transistor T1. The drain electrode of the third transistor T3 may be connected to the drain electrode of the fourth transistor 14, one terminal of the capacitor Cst, and the gate electrode of the first transistor T1. The third transistor 13 may be turned on depending on the scan signal Scan[n] transmitted through the scan line 151 to connect the gate electrode and the drain electrode of the first transistor T1 to each other, thereby diode-connecting the first transistor T1.

The gate electrode of the fourth transistor T4 may be connected to the scan line 152, the source electrode of the fourth transistor T4 may be connected to an initialization voltage VINT terminal, and the drain electrode of the fourth transistor T4 may be connected to one terminal of the capacitor Cst and the gate electrode of the first transistor T1 through the drain electrode of the third transistor T3. The fourth transistor T4 is turned on depending on the scan signal Scan[n−1] transmitted through the scan line 152 to transmit the initialization voltage VINT to the gate electrode of the first transistor T1, thereby performing an initialization operation of initializing the voltage of the gate electrode of the first transistor T1.

The gate electrode of the fifth transistor T5 may be connected to the control line 153, the source electrode of the fifth transistor T5 may be connected to the driving voltage line 172, and the drain electrode of the fifth transistor T5 may be connected to the source electrode of the first transistor T1 and the drain electrode of the second transistor T2.

The gate electrode of the sixth transistor T6 may be connected to the control line 153, the source electrode of the sixth transistor T6 may be connected to the drain electrode of the first transistor T1 and the source electrode of the third transistor T3, and the drain electrode of the sixth transistor T6 may be electrically connected to the anode of the light emitting diode (LED) ED. The fifth transistor T5 and the sixth transistor T6 are simultaneously turned on depending on the light emission control signal EM[n] transmitted through the control line 153, thereby the driving voltage ELVDD may be compensated through the diode-connected first transistor T1 and may be transmitted to the light emitting diode (LED) ED.

The gate electrode of the seventh transistor T7 may be connected to the scan line 154, the source electrode of the seventh transistor T7 may be connected to the drain electrode of the sixth transistor T6 and the anode of the light emitting diode (LED) ED, and the drain electrode of the seventh transistor T7 may be connected to the initialization voltage VINT terminal and the source electrode of the fourth transistor T4. The seventh transistor T7 of one pixel PX is connected to the scan line 152 connected to the fourth transistor T4 of the next pixel PX adjacent in the second direction DR2, thereby being simultaneously turned on with the fourth transistor T4 of the next pixel PX.

The transistors T1, T2, T3, T4, T5, T6, and T7 may be p-channel transistors such as a PMOS. In another example embodiment, at least one among the transistors T1, T2, T3, T4, T5, T6, and T7 may be an n-channel transistor.

In the example embodiment illustrated in FIG. 2, one terminal Cst1 of the capacitor Cst is connected to the gate electrode G1 of the first transistor T1 as described above, and the other terminal Cst2 thereof is connected to the driving voltage line 172. A cathode of the light emitting diode (LED) ED is connected to the terminal of the common voltage ELVSS transmitting the common voltage ELVSS to receive the common voltage ELVSS.

The structure of the pixel circuit corresponding to one pixel PX disposed in the first display area A according to an example embodiment may be varied relative to the structure shown in FIG. 2. For example, a number of transistors and a number of capacitors that are included in one pixel PX and a connection relationship thereof may be variously modified.

In the example embodiment illustrated in FIG. 3, one pixel circuit disposed in the second display area BB may be largely the same as most of one pixel circuit disposed in the first display area A shown in FIG. 2, while having the first transistor T1 formed in a double transistor structure, i.e. a pair of a first transistor T1-1 and a first transistor T1-2 coupled in parallel. Also, the capacitor Cst is formed of a double capacitor structure, that is, a pair of capacitor Cst_1 and capacitor Cst_2 coupled in parallel.

Referring again to FIG. 1, it is noted that FIG. 1 omits the scan lines 152 and 154 among the signal lines 151, 152, 153, 154, 171, and 172 shown in FIG. 2 and FIG. 3 for convenience of the drawing of FIG. 1. In a plan view, the scan line 151 and the control line 153 may be substantially extended in the first direction DR1, and the data line 171 and the driving voltage line 172 are substantially extended to the second direction DR2, thereby crossing the scan line 151 and the control line 153.

The data line 171 and the driving voltage line 172 may pass through both the first display area A and the second display area BB. Although not shown, the first display area A may also be disposed on the right or left side of the second display area BB shown in FIG. 1. In this case, the scan lines 151, 152, and 154 and the control line 153 passing through the second display area BB pass through the first display area A adjacent to the second display area BB in the first direction DR1, and may also be connected to the pixel circuit disposed in the first display area A.

Referring to FIG. 1, the first display area A and the second display area BB of the display device according to an example embodiment may further include a storage line 156 generally extended long in the first direction DR1, and a pixel electrode 191 and a connecting member 74 disposed corresponding to each pixel PX.

The storage line 156 may be disposed between the scan line 151 and the control line 153, which are connected to one pixel circuit.

The area on the plane of the pixel electrode 191 disposed in the second display area BB may be greater than the area on the plane of the pixel electrode 191 located in the first display area A, for example, for a given color pixel PX. In an example embodiment, the length in the second direction DR2 of the pixel electrode 191 disposed in the second display area BB may greater than the length in the second direction DR2 of the pixel electrode 191 disposed in the first display area A, and may be approximately k times thereof where k is greater than 1. In an example embodiment, k may be integer or non-integer, for example, k may be about 1.5.

In an example embodiment, k may be smaller than i (described above), and the interval between two pixel electrodes 191 neighboring in the second direction DR2 in the second display area BB may be greater than the interval between the two pixel electrodes 191 neighboring in the second direction DR2 in the second display area A. The region between two pixel electrodes 191 adjacent in the second direction DR2 in the region second display area BB may have higher light transmittance than the region where the pixel electrode 191 is disposed, and this region may be referred to as a light transmission region AA. The light transmission region AA disposed in the second display area BB is not shown, however it may be greater than the light transmission region of the first display area A. Thus, the region between the pixel electrodes 191 adjacent in the second direction DR2, and accordingly the light transmittance of the second display area BB may be higher than the light transmittance of the first display area A.

The connecting member 74 may be substantially extended long in the second direction DR2.

The layout and cross-sectional structure of one pixel circuit of the second display area BB of the display device according to an example embodiment will now be described in detail with reference to FIG. 4 and FIG. 5 along with FIG. 1, FIG. 2, and FIG. 3.

Figure 5:
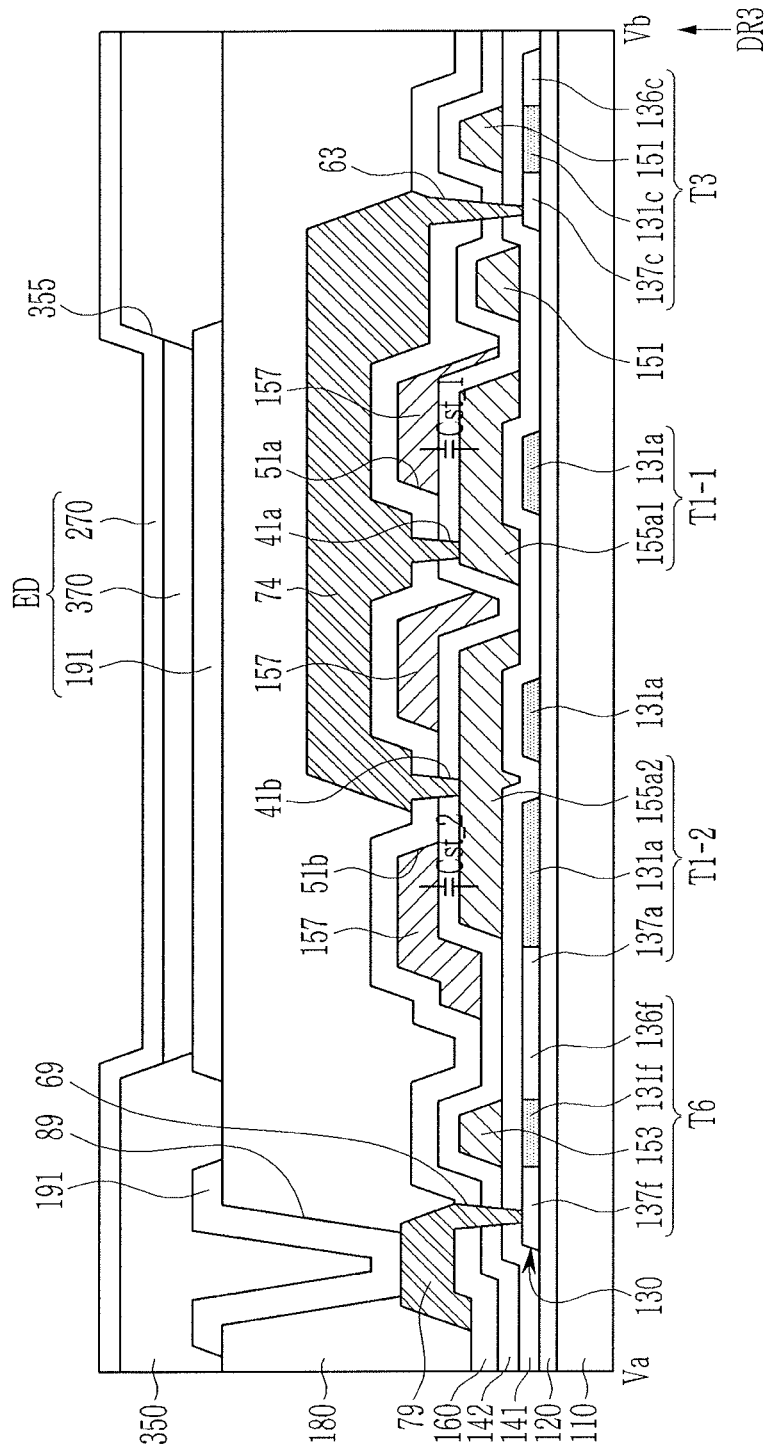
FIG. 5 illustrates a cross-sectional view of the display device shown in FIG. 4 taken along a line Va-Vb.

As illustrated in FIG. 5, a barrier layer 120 of an insulating layer may be disposed on an insulating substrate 110 made of a material such as glass, plastic, and the like, and an active pattern 130 may be disposed thereon. The active pattern 130 may include a plurality of channel regions 131$a$, 131$c$, and 131$f$ forming the channel of the plurality of transistors T1-1, T1-2, T2, T3, T4, T5, T6, and T7 included in one pixel circuit, and a conductive region. The conductive region of the active pattern 130 may include source regions 136$c$ and 136$f$ and drain regions 137$a$, 137$c$, and 137$f$ disposed on respective sides of the channel regions 131$a$, 131$c$, and 131$f$ of the transistors T1-1, T1-2, T2, T3, T4, T5, T6, and T7.

The active pattern 130 may include a semiconductor material such as amorphous silicon, polysilicon, an oxide semiconductor, and the like.

A first insulating layer 141 may be disposed on the active pattern 130, and a first conductive layer may be disposed on the first insulating layer 141. The first conductive layer may include a plurality of scan lines 151 (although not shown, also including the above-described scan lines 152 and 154), the control line 153, and driving gate electrodes 155$a$1 and 155$a$2. In a plan view, the driving gate electrode 155$a$1 and the driving gate electrode 155$a$2 may be arranged in the second direction DR2 between the scan line 151 and the control line 153.

A second insulating layer 142 may be disposed on the first conductive layer and the first insulating layer 141, and a second conductive layer may be disposed on the second insulating layer 142. The second conductive layer may include a storage line 156, and the like. The storage line 156 may include an expansion 157 overlapping the driving gate electrodes 155$a$1 and 155$a$2.

A third insulating layer 160 may be disposed on the second conductive layer and the second insulating layer 142.

At least one of the barrier layer 120, the first insulating layer 141, the second insulating layer 142, and the third insulating layer 160 may include an inorganic insulating material such as a silicon nitride ($SiN_x$), a silicon oxide ($SiO_x$), a silicon oxynitride (SiON), and/or an organic insulating material. The first insulating layer 141, the second insulating layer 142, and the third insulating layer 160 may include contact holes 62, 63, 67, and 69, and the second insulating layer 142 and the third insulating layer 160 may include contact holes 41$a$ and 41$b$.

A third conductive layer may be disposed on the third insulating layer 160. The third conductive layer may include a plurality of connecting members 74 and 79, a data line 171, and a driving voltage line 172.

The pair of driving gate electrodes 155$a$1 and 155$a$2 may be connected to the connecting member 74 through the contact holes 41$a$ and 41$b$. The contact holes 41$a$ and 41$b$ may be respectively disposed in holes 51$a$ and 51$b$ included in the expansion 157 of the storage line 156.

In the present example embodiment, the first transistor T1-1 includes the channel region 131$a$ of the active pattern 130 overlapping the driving gate electrode 155$a$1 and the driving gate electrode 155$a$1, and the source region and the drain region disposed on respective sides of the channel region 131$a$. The first transistor T1-2 includes the channel region 131$a$ of the active pattern 130 overlapping the driving gate electrode 155$a$2 and the driving gate electrode 155$a$2, and the source region and the drain region 137$a$ on respective sides of the channel region 131$a$.

The second transistor T2 includes part of the scan line 151, the channel region of the active pattern 130 overlapping the part of the scan line 151, and the source region and the drain region disposed on respective sides of the channel region. The source region of the second transistor T2 may be connected to the data line 171 through the contact hole 62, and the drain region of the second transistor T2 may be connected to the source region of a pair of first transistors T1-1 and T1-2.

The third transistor T3 may include a pair of transistors connected in series. The third transistor T3 includes part of the scan line 151, the channel region 131$c$ of the active pattern 130 overlapping the part of the scan line 151, and the source region 136$c$ and the drain region 137$c$ disposed on respective sides of the channel region 131$c$.

The fifth transistor T5 includes part of the control line 153, the channel region of the active pattern 130 overlapping the part of the control line 153, and the source region and the drain region disposed on respective sides of the channel region. The source region of the fifth transistor T5 may be connected to the driving voltage line 172 through the contact hole 67, and the drain region of the fifth transistor T5 may be connected to the source region of the first transistor T1-1 and T1-2.

The sixth transistor T6 includes a part of the control line 153, the channel region 131$f$ of the active pattern 130 overlapping the part of the control line 153, and the source region 136$f$ and the drain region 137$f$ disposed on respective sides of the channel region 131$f$. The source region 136$f$ is connected to the drain region 137$a$ of the first transistors T1-1 and T1-2, and the drain region 137$f$ is connected to the connecting member 79 through the contact hole 69.

The fourth transistor T4 and the seventh transistor T7 are not shown in FIG. 4 and FIG. 5, however the fourth transistor T4 may be disposed above the third transistor T3, and the seventh transistor T7 may be disposed below the sixth transistor T6. Further, the positions of the fourth transistor T4 and the seventh transistor T7 are not limited thereto.

Among the pair of capacitors Cst_1 and Cst_2 included in one pixel circuit of the second display area BB, the capacitor Cst_1 may include the driving gate electrode 155$a$1 and the expansion 157 of the storage line 156 overlapping each other via the second insulating layer 142 as two terminals, and the capacitor Cst_1 may include the driving gate electrode 155a2 and the expansion 157 of the storage line 156 overlapping each other via the second insulating layer 142 as two terminals.

Although not shown, the storage line 156 or the expansion 157 of the storage line 156 may be connected to the driving voltage line 172, thereby receiving the driving voltage ELVDD.

At least one of the first conductive layer, the second conductive layer, and the third conductive layer may include at least one among metals such as copper (Cu), aluminum (Al), magnesium (Mg), silver (Ag), gold (Au), platinum (Pt), palladium (Pd), nickel (Ni), neodymium (Nd), iridium (Ir), molybdenum (Mo), tungsten (W), titanium (Ti), chromium (Cr), tantalum (Ta), alloys thereof, etc. Each of the first conductive layer, the second conductive layer, and the third conductive layer may include a single layer or multiple layers.

A fourth insulating layer 180 may be disposed on the third conductive layer. The fourth insulating layer 180 may include a contact hole 89 disposed on the connecting member 79. The fourth insulating layer 180 may include the inorganic insulating material and/or the organic insulating material such as a polyimide, an acryl-based polymer, or a siloxane-based polymer.

A pixel electrode layer may be disposed on the fourth insulating layer 180. The pixel electrode layer may include a pixel electrode 191 disposed at each pixel PX of the second display area BB. The pixel electrode 191 may be electrically connected to the connecting member 79 through the contact hole 89. The pixel electrode layer may include a transflective conductive material or a reflective conductive material. The pixel electrode layer may include a metal such as silver (Ag).

The shape of the pixel electrode 191 may be generally rectangular except at the part that is connected to the connecting member 79, for example. In the first and second display areas A and BB, the planar size of the pixel electrode 191 may be different for each pixel PX. For example, the size of the pixel electrode 191 corresponding to the green pixel G may be smaller than the size of the pixel electrode 191 of the red pixel R or the blue pixel B.

A fifth insulating layer 350 may be disposed on the fourth insulating layer 180. The fifth insulating layer 350 is also referred to as a pixel defining layer. The fifth insulating layer 350 may have an opening 355 formed on the pixel electrode 191. The fifth insulating layer 350 may include the organic insulating material such as a polyacryl-based resin or a polyimide resin.

An emission layer 370 may be disposed above the pixel electrode 191. The emission layer 370 may include a portion disposed within the opening 355 of the fifth insulating layer 350. The emission layer 370 may include an organic light emission material or an inorganic light emission material.

A common electrode 270 may be disposed above the emission layer 370. The common electrode 270 may also be formed over the fifth insulating layer 350 and be continuously formed over the plurality of pixels PX. The common electrode 270 may include a conductive transparent material.

The pixel electrode 191, the emission layer 370, and the common electrode 270 of each pixel PX together may form the light emitting diode (LED) ED, and one of the pixel electrode 191 and the common electrode 270 may be the cathode, while the other may be the anode.

The structure of the first display area A may be the same as most of the structure of the above-described second display area BB, while the first transistor T1 may be formed of a single transistor and the capacitor Cst is formed of a single capacitor.

The common electrode 270 may be formed from a single continuous electrode in the first display area A and the second display area BB.

The pixel electrode 191 of the second display area BB may have a greater area than the pixel electrode 191 in the first display area A. In such a case, if the driving current of the same magnitude flows to the pixel electrode 191 of the second display area BB and the pixel electrode 191 of the first display area A, the luminance of the second display area BB may be lower than the luminance of the first display area A for the same image signal, and the boundary between the first display area A and the second display area BB may be recognized. Thus, according to the present example embodiment, the first transistor of the second display area BB may be formed as the double transistor structure including a pair of the first transistor T1-1 and the first transistor T1-2. Thus, the driving current flowing to the pixel electrode 191 of the second display area BB may be increased, thereby reducing a luminance difference of the second display area BB from the first display area A.

Figure 4:
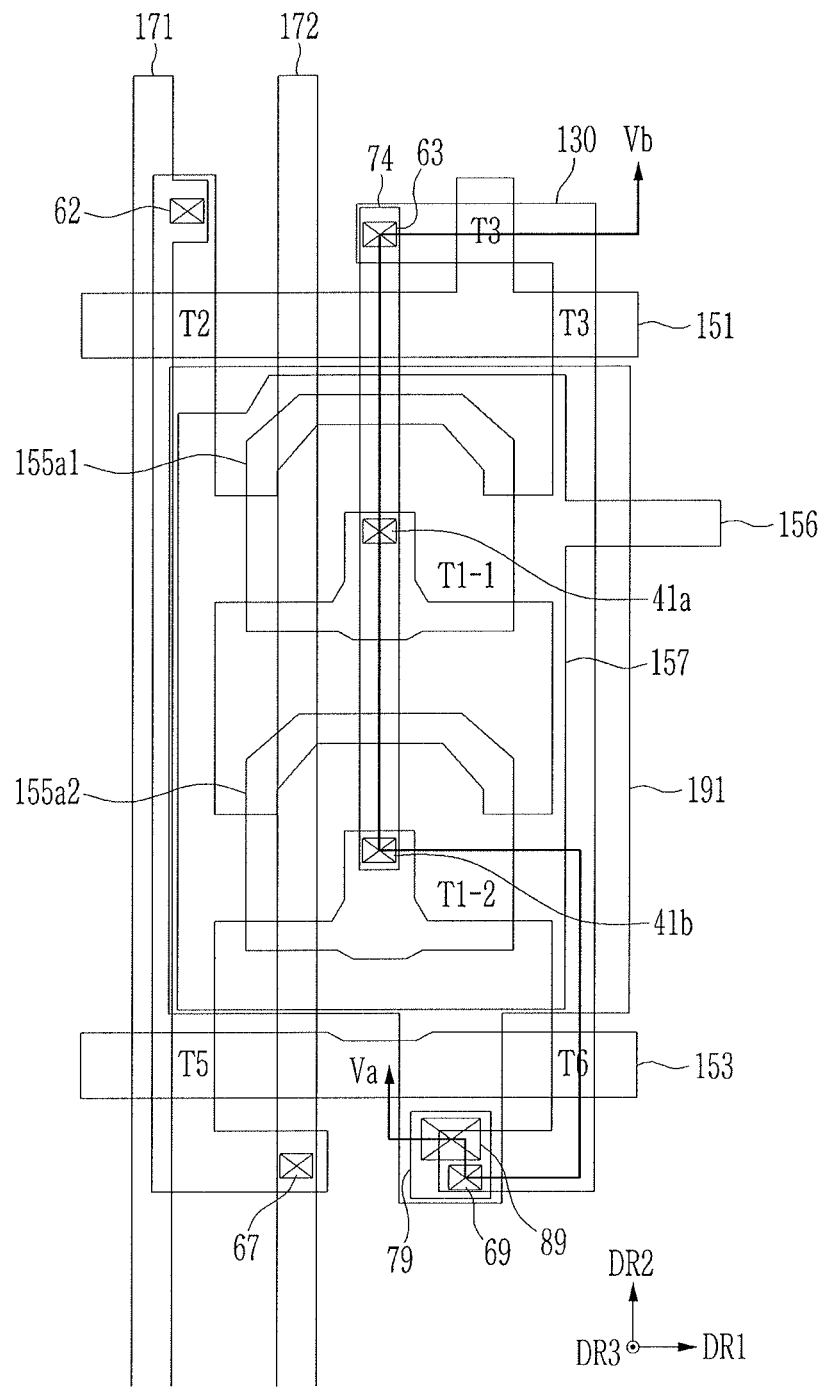
FIG. 4 illustrates a detailed layout view of a pixel circuit of a display device shown in FIG. 1.

As shown in FIG. 4, the driving gate electrodes 155a1 and 155a2 of the pair of a first transistor T1-1 and a first transistor T1-2 included in one pixel circuit may be connected through one connecting member 74. Accordingly, even if the driving gate electrode 155a1 and the driving gate electrode 155a2 are separated, the threshold voltage of the first transistor T1-1 and the first transistor T1-2 may be simultaneously compensated, and it may be possible to minimize the scattering by the separated driving gate electrode 155a1 and the driving gate electrode 155a2.

A display device according to an example embodiment will now be described with reference to each of FIG. 6, FIG. 7, FIG. 8, and FIG. 9 along with the above-described drawings.

Figure 6:
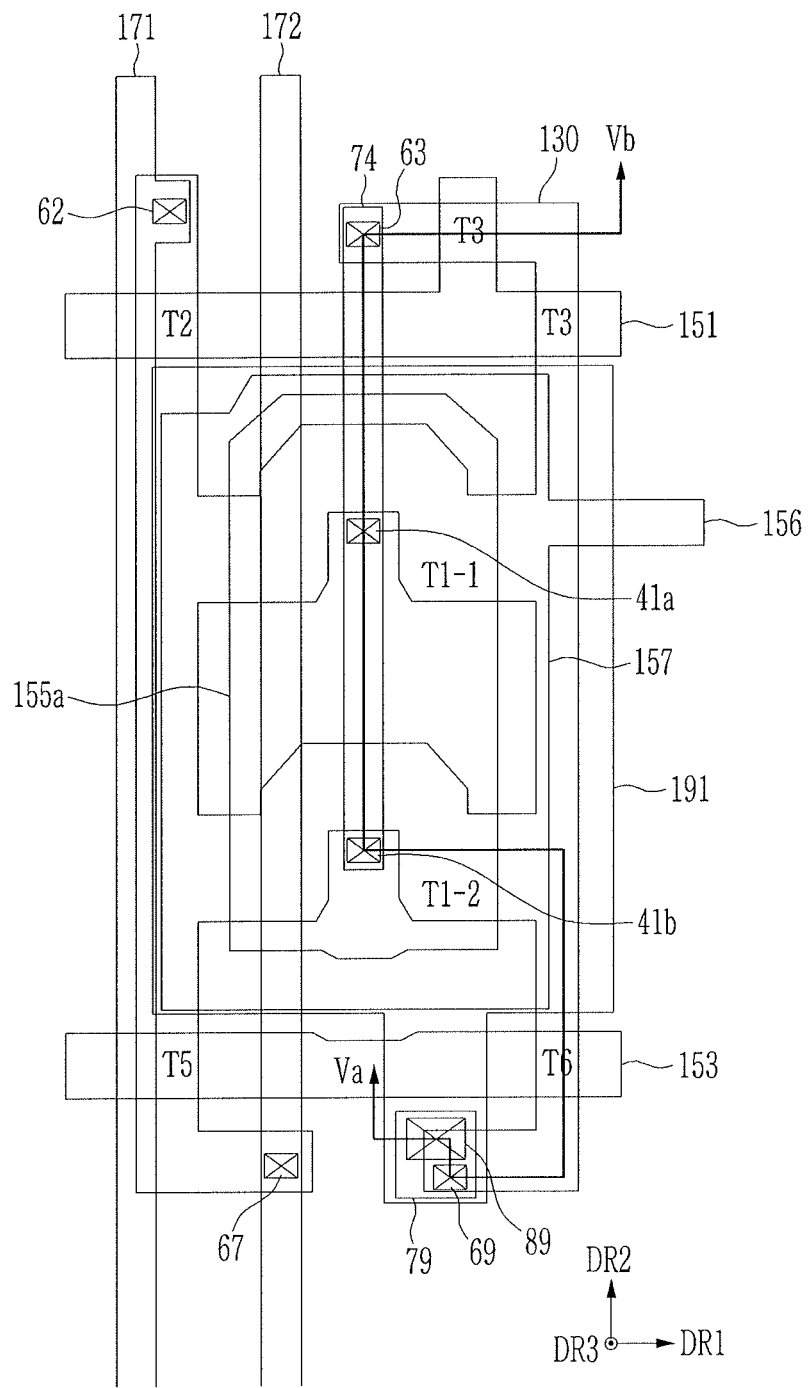
FIG. 6 illustrates a detailed layout view of a pixel circuit of a display device shown in FIG. 1, FIG. 7, FIG. 8, FIG. 9, and FIG. 10 illustrate layout views of two display areas of a display device according to an example embodiment, respectively.

Referring to FIG. 6, the display device according to an example embodiment may be the same as most of the display device according to the above-described example embodiment, while having a pair of driving gate electrodes 155a1 and 155a2 included in one pixel circuit of the second display area BB connected to each other to form one electrode.

Figure 7:
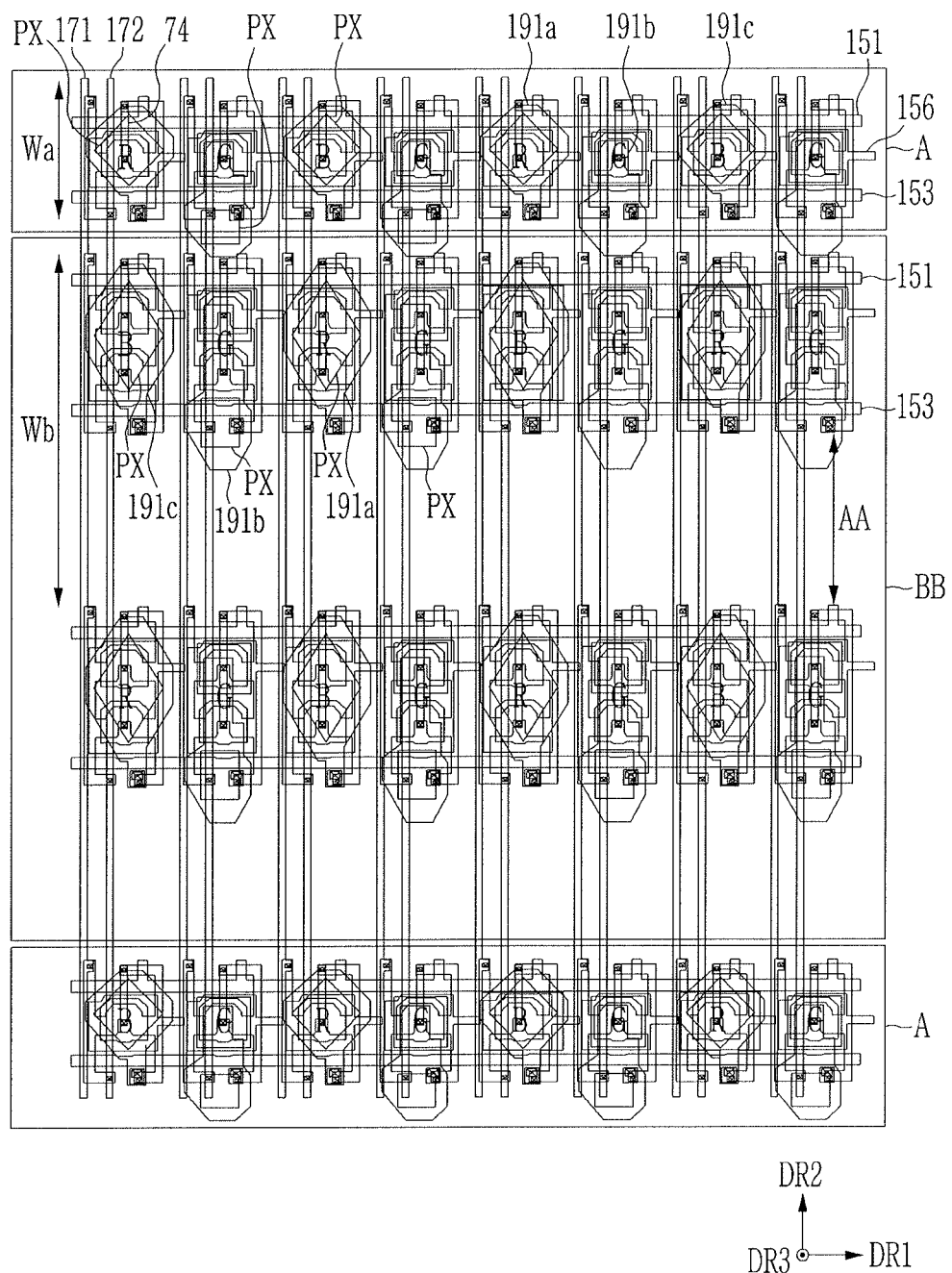

Next, referring to FIG. 7, the display device according to an example embodiment may be the same as most of the display device according to the above-described example embodiment, while the shape and/or the size of the pixel electrode of the first and second display areas A and BB may be different from each other. The shape of the pixel electrode 191 of the red pixel R and the blue pixel B in the first and second display areas A and BB may be roughly rhomboid, and the shape of the green pixel G may be rhomboid or rectangular. In the first and second display areas A and BB, the planar size of the pixel electrode 191 of the green pixel G may be less than the planar size of the pixel electrode 191 of the red pixel R and the blue pixel B. In addition, the planar size of the pixel electrode 191 of the blue pixel B may be greater than the planar size of the pixel electrode 191 of the red pixel R.

Figure 8:
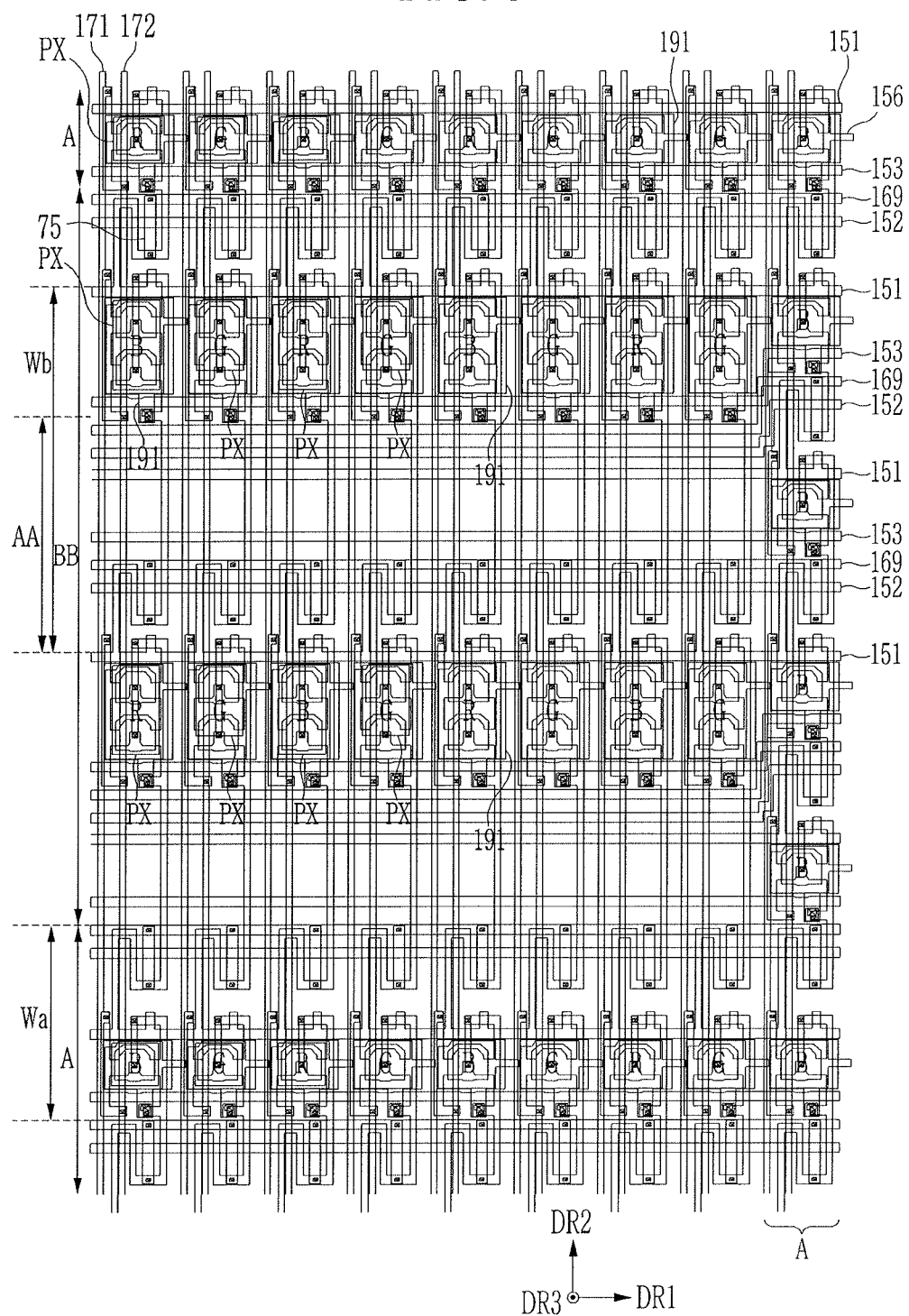

Next, referring to FIG. 8, the display device according to an example embodiment may be the same as most of the display device according to the above-described example embodiment, while showing the scan line 152 that was shown in FIG. 2 (but not shown in FIG. 1 and FIG. 4), and an initialization voltage line 169 for transmitting the initialization voltage VINT and a connecting member 75 may be further included.

The scan line 152 and the initialization voltage line 169 may be disposed above the scan line 151 for one pixel PX in a plan view, and the scan line 152 may be disposed between the initialization voltage line 169 and the scan line 151. The initialization voltage line 169 may be disposed in the second conductive layer in which the storage line 156 is disposed.

The active pattern 130 overlapping the scan line 152 may form the channel regions of the above-described fourth transistor T4 and seventh transistor T7. The connecting member 75 may be disposed in the third conductive layer and may electrically connect the initialization voltage line 169 and one conductive region of the active pattern 130, for example the conductive region between the fourth transistor T4 and the seventh transistor T7.

The pixel circuit of each pixel row may be connected to the scan lines 151 and 152, the control line 153, the storage line 156, and the initialization voltage line 169 of one group.

The right region of FIG. 8 corresponds to the part of the first display area A adjacent to the second display area BB. At least part of the scan line 152, the control line 153, and the initialization voltage line 169 may be bent on the boundary between the second display area BB and the first display area A adjacent in the first direction DR1.

In the second display area BB, the initialization voltage line 169, the scan lines 151 and 152, and the control line 153 disposed in the light transmission region AA as the region between two pixels PX adjacent in the second direction DR2 may not be connected to any pixel circuit.

Other features of the present example embodiment may be the same as in the example embodiment shown in FIG. 1 to FIG. 7 described above.

Figure 9:
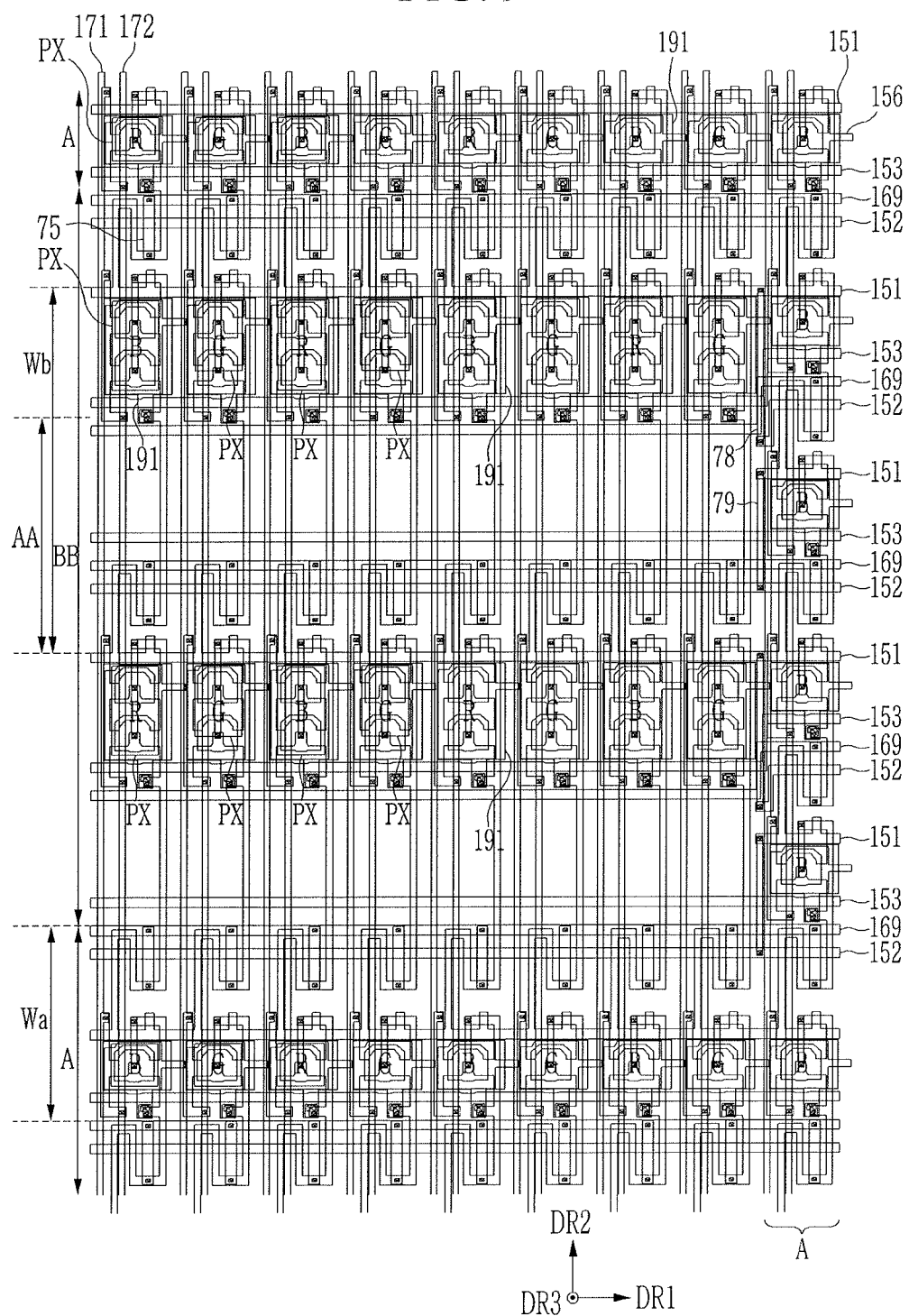

Next, referring to FIG. 9, the display device according to an example embodiment may be the same as most of the display device according to the example embodiment shown in FIG. 8, while the scan lines 151 and 152 disposed in the light transmission region AA as the region between two pixels PX adjacent in the second direction DR2 may be omitted in the second display area BB. Instead, the scan line 151 disposed in the first display area A adjacent to the light transmission region AA in the first direction DR1 may be electrically connected to the scan line 152 of the subsequent stage through the connecting member 79, which may be disposed in the third conductive layer, thereby receiving the scan signal. The scan line 152 disposed in the first display area A adjacent to the light transmission region AA in the first direction DR1 may be electrically connected to the scan line 151 of the previous stage through a connecting member 78 which may be disposed in the third conductive layer, thereby receiving the scan signal.

Each of the connecting members 78 and 79 may be extended in the second direction DR2, and may be disposed near the boundary between the second display area BB and the first display area A neighboring in the first direction DR1.

According to the example embodiment shown in FIG. 9, the number of signal lines disposed in the light transmission region AA of the second display area BB may be reduced compared with the example embodiment shown in FIG. 8 such that the light transmittance of the second display area BB may be further enhanced.

A display device according to an example embodiment will now be described with reference to FIG. 10 to FIG. 12 along with the above-mentioned drawings.

The display device according to the present example embodiment may be the same as most of the display device according to the example embodiment shown in FIG. 1 to FIG. 5 described above, while the second display area BB may be different. Differences from the example embodiment shown in FIG. 1 to FIG. 5 will now be described.

Figure 10:
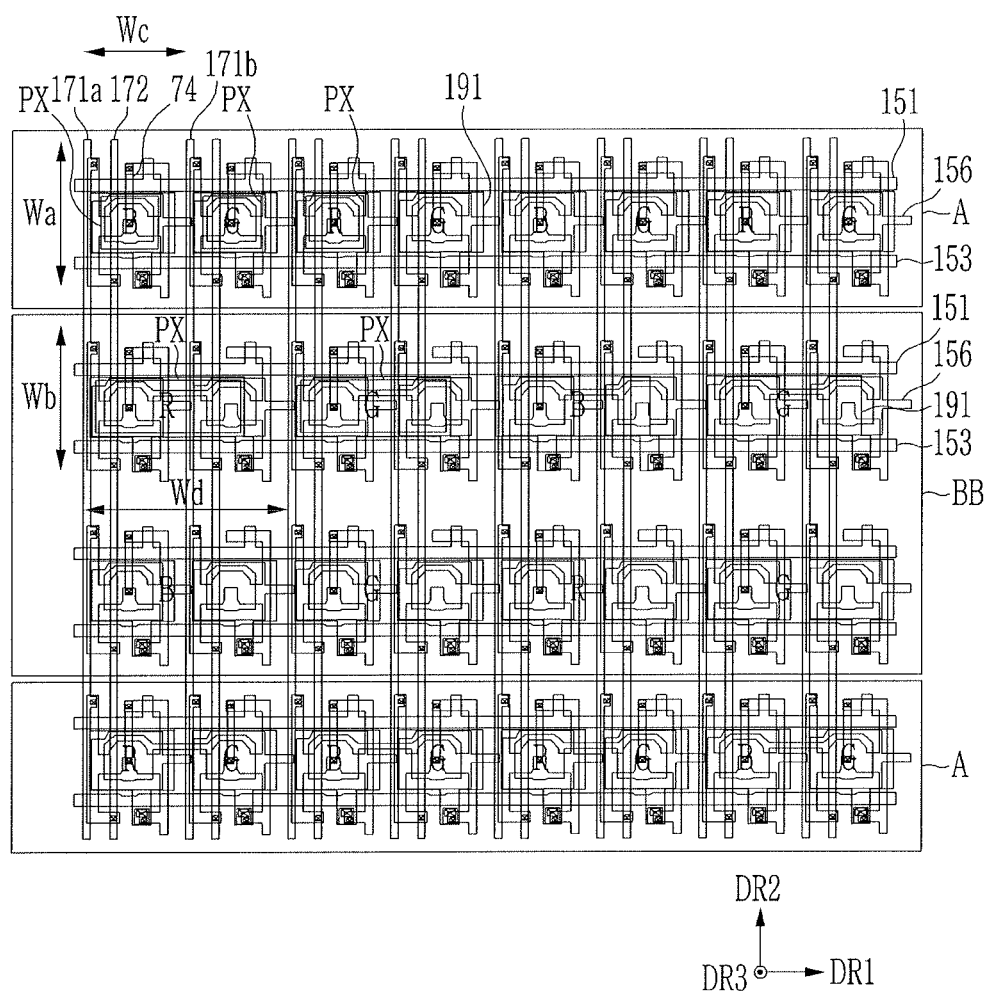

In FIG. 10, an odd-numbered data line 171*a* and an even-numbered data line 171*b* may be the same as the above-described data line 171.

The resolution in the first direction DR1 in the second display area BB may be lower than the resolution in the first direction DR1 in the first display area A. For example, the pitch Wd of the pixel PX or the pixel electrode 191 in the first direction DR1 in the second display area BB may be greater than the pitch We of the pixel PX or the pixel electrode 191 in the first direction DR1 in the first display area A, and the pitch Wd may be about m times the pitch We where m is greater than 1. For example, m may be an integer or non-integer and may be, for example, 2. The pitch Wd may be the same as the pitch of the odd-numbered data line 171*a* and the pitch of the even-numbered data line 171.

The resolution in the second direction DR2 in the second display area BB may be the same as or similar to the resolution in the second direction DR2 in the first display area A. Thus, the pitch Wb of the pixel PX or the pixel electrode 191 in the second direction DR2 in the second display area BB may be the same as or similar to the pitch Wa of the pixel PX or the pixel electrode 191 in the second direction DR2 in the first display area A. In another example embodiment, as described above, the pitch Wb may be greater than the pitch Wa.

The length in the first direction DR1 of the pixel PX disposed in the second display area BB may be greater than the length in the first direction DR1 of the pixel PX disposed in the first display area A, and may be approximately n times thereof where n is greater than 1. For example, n may be integer or non-integer and may be, for example, about 1.5.

The area on the plane of the pixel electrode 191 located in the second display area BB may be greater than the area on the plane of the pixel electrode 191 located in the first display area A. The length in the first direction DR1 of the pixel electrode 191 disposed in the second display area BB may be greater than the length in the first direction DR1 of the pixel electrode 191 disposed in the first display area A, and may be approximately p times thereof, which p is greater than 1. For example, p may be integer or non integer and may be, for example, about 1.5.

In an example embodiment, p may be less than m, and the interval between two pixel electrodes 191 neighboring in the first direction DR1 in the second display area BB may be greater than the interval between the two pixel electrodes 191 neighboring in the first direction DR1 in the first display area A. Thus, the light transmittance of the second display area BB may be higher than the light transmittance of the first display area A.

The pixel electrode 191 disposed in the second display area BB may overlap at least one of data lines 171*a* and 171*b* and at least one driving voltage line 172.

The structure of the pixel circuit corresponding to one pixel PX disposed in the first display area A of FIG. 10 may be the same as the structure of the pixel circuit shown in FIG. 2 described above.

Figure 11:
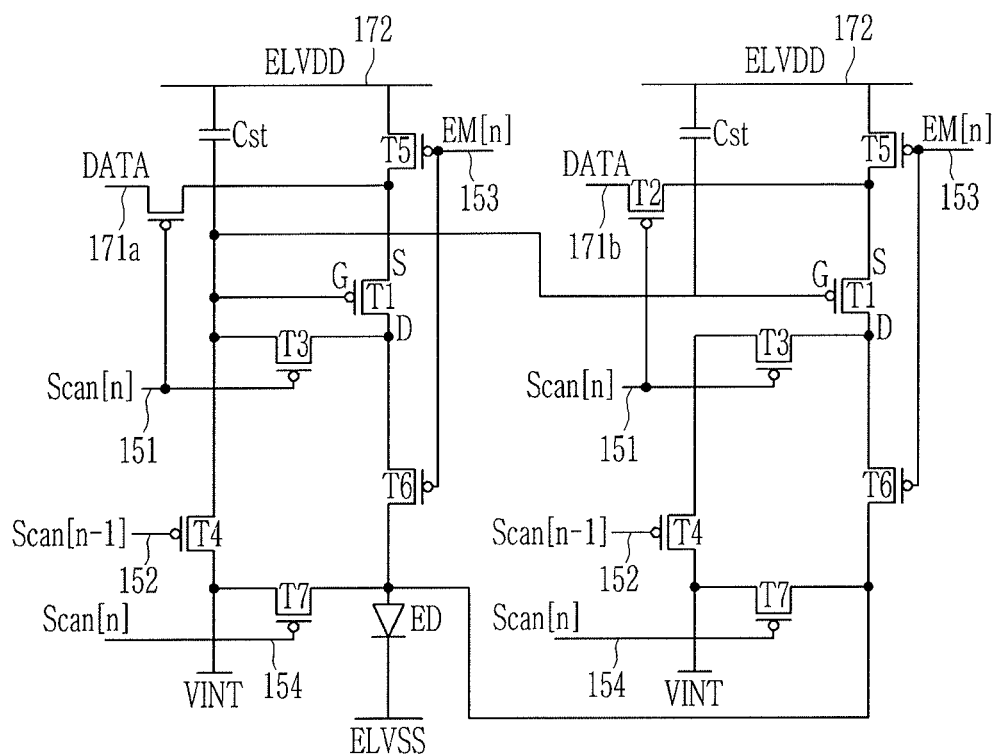
FIG. 11 illustrates a circuit diagram of a pixel circuit disposed in one display area of a display device according to an example embodiment.

FIG. 11 is a circuit diagram of the pixel circuit corresponding to one pixel PX disposed in the second display area BB of FIG. 10.

Referring to FIG. 11, one pixel circuit disposed in the second display area located in the second display area BB may include at least two circuits (which may be referred to as left and right circuits in relation to FIG. 11) that are similar to the pixel circuit shown in FIG. 2 described above. The left and right circuits having the similar structure to each other may be connected to the same scan lines 151, 152, and 154, the same control line 153, and the same initialization voltage line, and the left and right circuits may be respectively connected to a pair of two adjacent data lines 171a and 171b and two adjacent driving voltage lines 172.

The gate electrode G of the first transistor Ti of the left circuit and the gate electrode G of the first transistor T1 of the right circuit may be connected to each other. The gate electrode G of the first transistor T1 of the right circuit may be separated from the third transistor T3 and the fourth transistor T4, as compared to the left circuit of FIG. 2 and FIG. 11. Accordingly, in the pixel circuit shown in FIG. 11, the compensation operation for the data signal DATA transmitted by the data line 171b connected to the right circuit may not be performed.

The drain electrode of the sixth transistor T6 of the left circuit and the drain electrode of the sixth transistor T6 of the right circuit may be connected to each other and may be connected to the anode of one light emitting diode (LED) ED. Thus, the pixel circuit of one pixel PX disposed in the second display area BB may includes a pair of each of the transistors T1, T2, T3, T4, T5, T6, and T7, but it may include only one light emitting diode.

The structure of one pixel circuit of the second display area BB of the display device according to an example embodiment will now be described with reference to FIG. 12 along with FIG. 11 and FIG. 10. The same description of the same constituent elements described above may be omitted.

In a plan view, two driving gate electrodes 155a3 and 155a4 adjacent in the first direction DR1 may be disposed between the scan line 151 and the control line 153. The two driving gate electrodes 155a3 and 155a4 may be electrically connected to each other via a connection part 55 disposed on the first conductive layer. Therefore, the two driving gate electrodes 155a3 and 155a4 may be charged with the same voltage.

The storage line 156 may include an expansion 157 overlapping each of the two driving gate electrodes 155a3 and 155a4.

One of two driving gate electrodes 155a3 and 155a4 may be connected with the connecting member 74 via a contact hole 41, and the other may not be connected with the connecting member 74. Therefore, the driving gate electrodes 155a3 and 155a4, which are not connected to the connecting member 74, may not be connected to the third transistor T3. Referring to FIG. 10, in the plurality of pixel circuits arranged in the first direction DR1 on the second display area BB, the position of the connecting member 74 may be alternately arranged on the structure disposed on the left circuit and the structure disposed on the right circuit.

The active pattern 130 corresponding to each of two driving gate electrodes 155a3 and 155a4 overlaps the scan line 151, the control line 153, and each of the driving gate electrodes 155a3 and 155a4, thereby forming the channel region, the source region, and the drain region of the transistor T1, T2, T3, T5, and T6.

Each of the driving gate electrodes 155a3 and 155a4 and each expansion 157 of the storage line 156 overlapping each other may form the capacitor Cst.

One pixel electrode 191 corresponding to one pixel circuit may be electrically connected to a pair of connecting members 79 connected to a pair of sixth transistors T6 through the contact holes 89. However, as described above, in the pixel circuit shown in FIG. 11 and FIG. 12, the compensation operation for the data signal DATA transmitted by the data line 171b connected to the right circuit may not be performed.

According to the present example embodiment, one pixel electrode 191 receives the driving current through a pair of contact holes 89, which may facilitate the driving current input.

Figure 12:
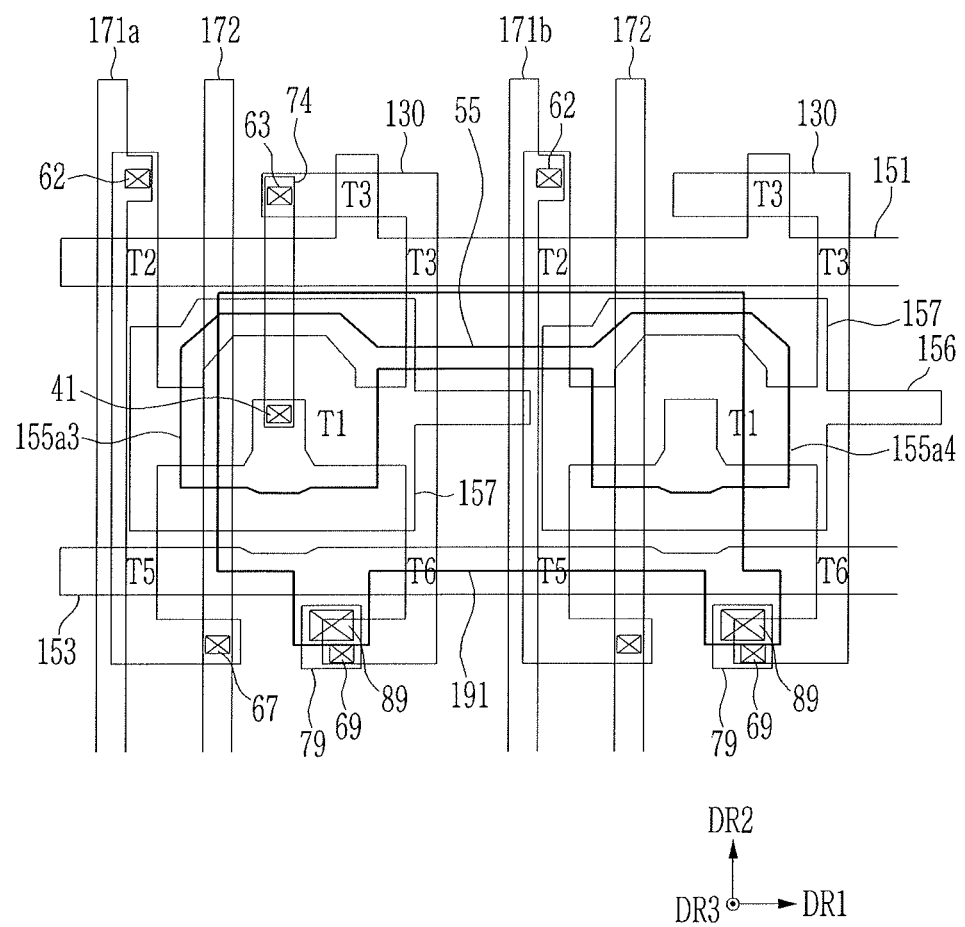
FIG. 12 illustrates a detailed layout view of a pixel circuit of a display device shown in FIG. 10.

In FIG. 12, the second transistor T2 is connected to the data line 171b through the contact hole 62 in the right circuit as well as the left circuit. Thus, it may be possible to prevent the active pattern 130 disposed in the right circuit from floating and the display quality from being deteriorated.

According to the present example embodiment, in the second display area BB, the light emitting diode (LED) ED of one pixel circuit receives the driving current through a pair of first transistors Ti and a pair of sixth transistors T6. Thus, it may be possible to easily input the driving current to the pixel electrode 191 of the second display area BB or to increase the driving current flowing to the pixel electrode 191 so that a luminance difference of the second display area BB relative to the first display area A may be reduced.

In addition, the features of the present example embodiment may be the same as the various example embodiments described above.

A display device according to an example embodiment will now be described with reference to each of FIG. 13, FIG. 14, FIG. 15, and FIG. 16 along with FIG. 10 to FIG. 12.

Figure 13:
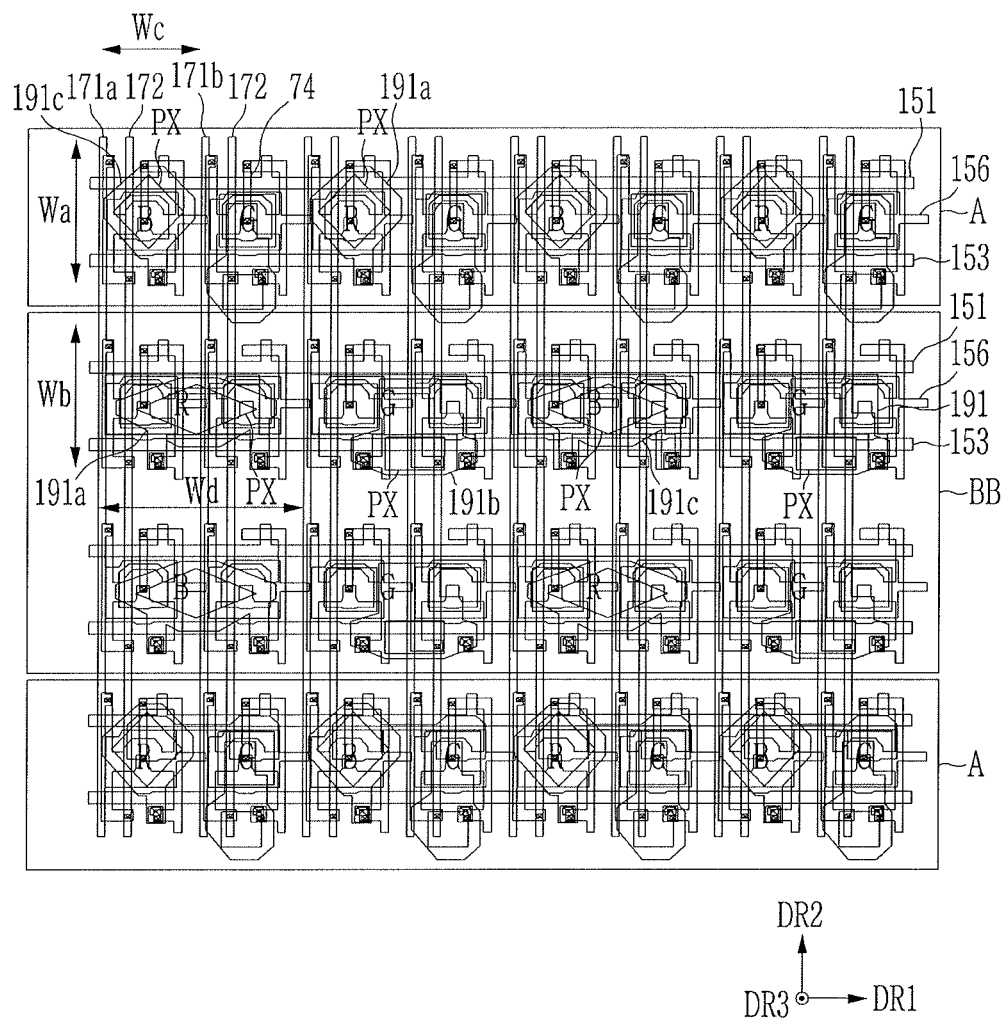
FIG. 13 illustrates a layout view of two display areas of a display device according to an example embodiment.

First, referring to FIG. 13, a display device according to an example embodiment may be the same as most of the display device shown in FIG. 10 to FIG. 12 described above, while the shape and/or the size of the pixel electrode of the first and second display areas A and BB may be different. In the first and second display areas A and BB, the shape of the pixel electrode 191a of the red pixel R and the pixel electrode 191c of the blue pixel B may be roughly rhomboid, and the shape of the pixel electrode 191b of the green pixel G may be rhomboid or rectangular. In the first and second display areas A and BB, the planar size of the pixel electrode 191b of the green pixel G may be smaller than the planar size of the pixel electrode 191a of the red pixel R and the pixel electrode 191c of the blue pixel B. In addition, the planar size of the pixel electrode 191c of the blue pixel B may be greater than the planar size of the pixel electrode 191a of the red pixel R.

Figure 14:
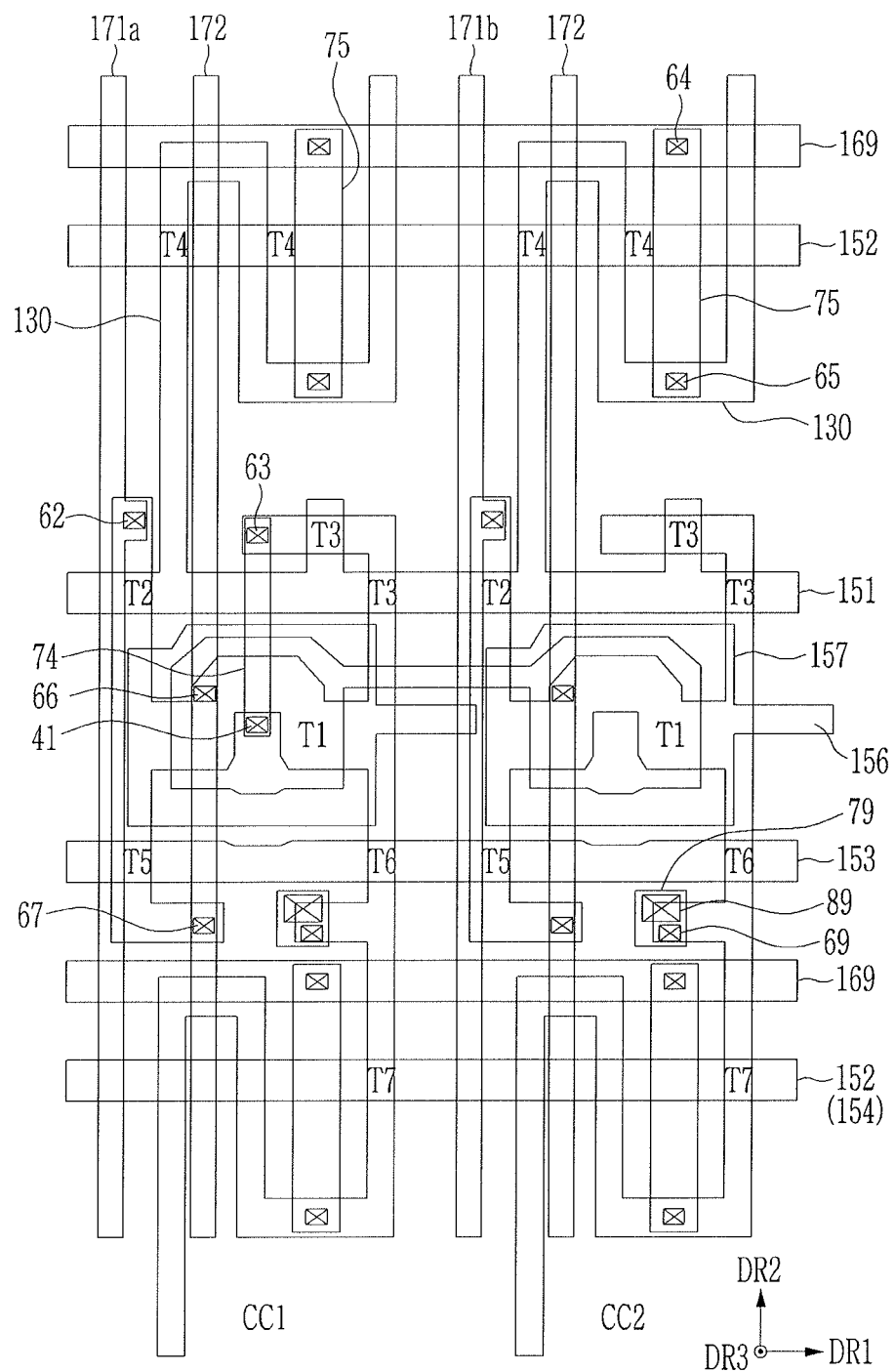
FIG. 14, FIG. 15, and FIG. 16 illustrate detailed layout views of a pixel circuit of a display device shown in FIG. 10, respectively.

Next, referring to FIG. 14, a display device according to an example embodiment may be the same as most of the display device shown in FIG. 12 described above, while the scan line 152, the initialization voltage line 169, and the connecting member 75 that are omitted in FIG. 12 are also shown. The features of the scan line 152, the initialization voltage line 169, and the connecting member 75 may be the same as described above.

The active pattern 130 overlapping the scan line 152 may form the channel region of the above-described fourth transistor T4 and seventh transistor T7. The connecting member 75 may be disposed in the third conductive layer and may electrically connect the initialization voltage line 169 and one conductive region of the active pattern 130, for example the conductive region between the fourth transistor T4 and the seventh transistor T7 through the contact holes 64 and 65.

The storage line 156 may be electrically connected to the driving voltage line 172 through a contact hole 66 to receive the driving voltage ELVDD.

In the example embodiment shown in FIG. 14, the connecting member 74 is disposed in the left circuit CC1 included in one pixel circuit, however the connecting member 74 may not be disposed in the right circuit CC2. Alternatively, in another pixel circuit adjacent in the first direction DR1, the connecting member 74 may not be disposed in the left circuit CC1 and the connecting member 74 may be disposed in the right circuit CC2.

Both the left circuit CC1 and the right circuit CC2, which the pixel circuit contains, may contain the transistors T1, T2, T3, T4, T5, T6, and T7.

Figure 15:
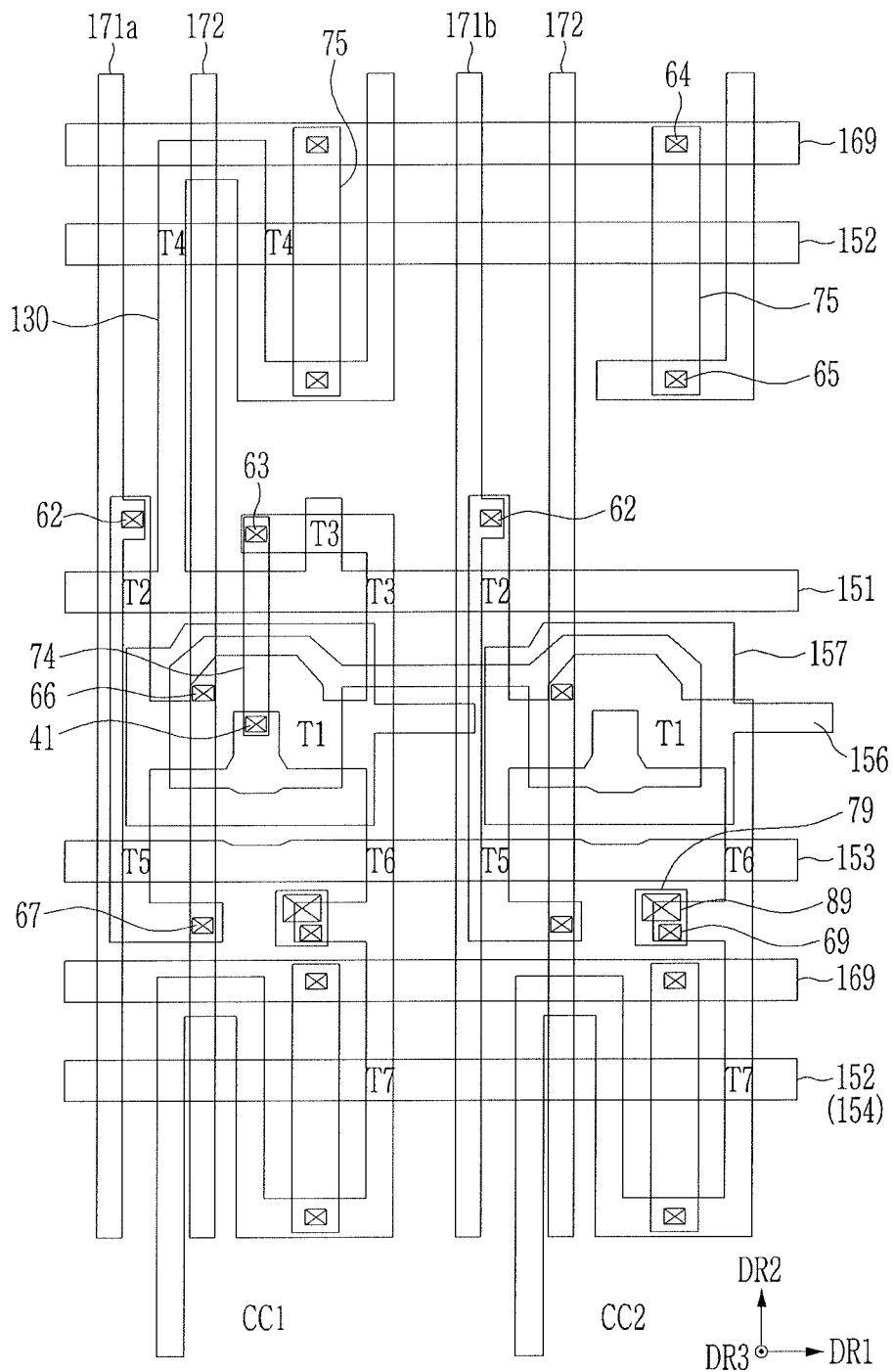

Next, referring to FIG. 15, a display device according to an example embodiment may be the same as most of the display device shown in FIG. 12 described above, while one circuit of the left circuit CC1 and the right circuit CC2, for example the right circuit CC2, may not include the third transistor T3 and the fourth transistor T4. If the circuit without the connecting member 74 is the left circuit CC1, the left circuit CC1 may not include the third transistor T3 and the fourth transistor T4.

Figure 16:
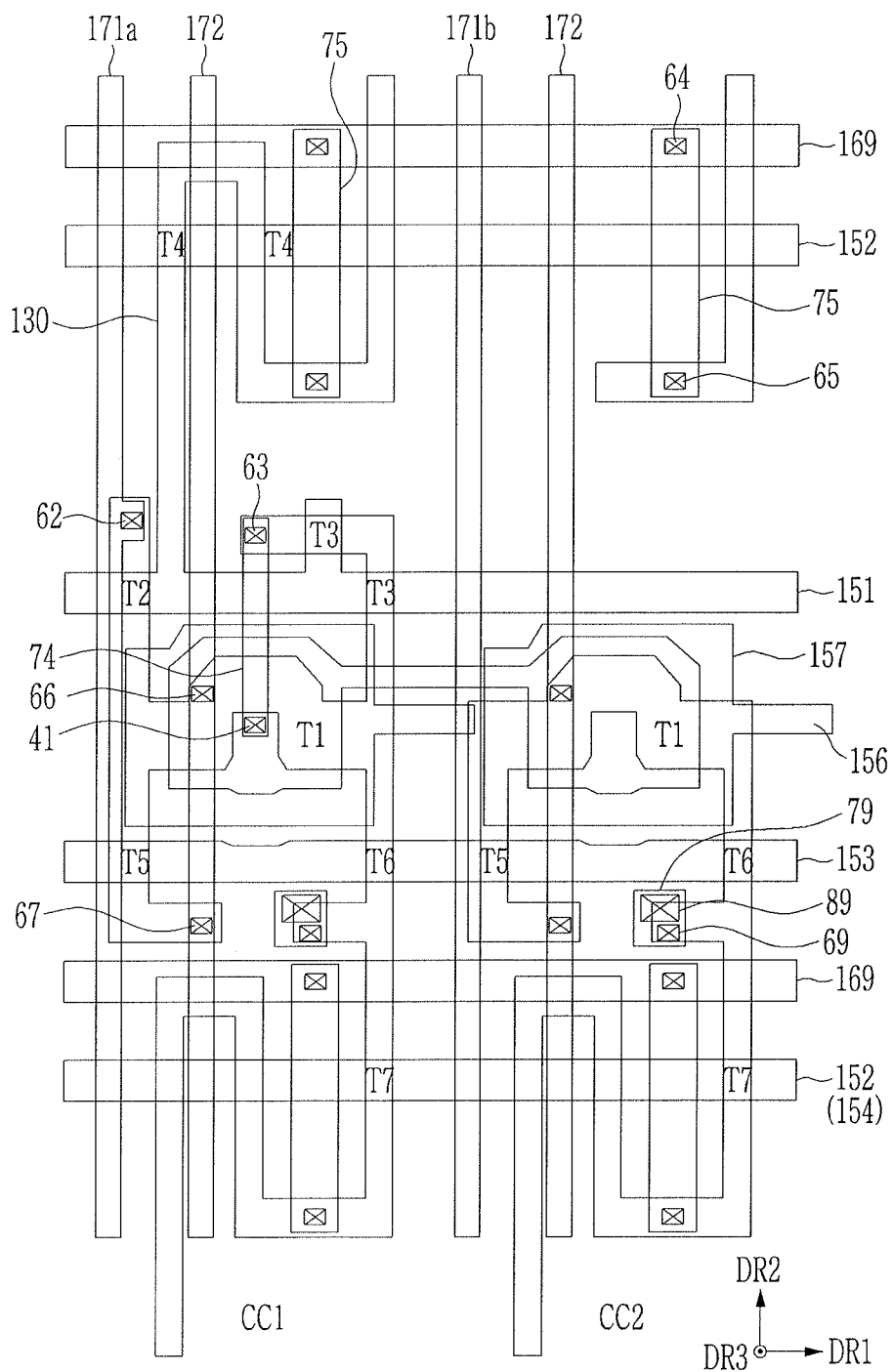

Next, referring to FIG. 16, a display device according to an example embodiment may be the same as most of the display device shown in FIG. 15 described above, while the data line 171b may be separated from the active pattern 130 in the right circuit CC2 without the connecting member 74. Thus, the right circuit CC2 may not include the contact hole 62. If the circuit that does not include the connecting member 74 is the left circuit CC1, the data line 171a in the left circuit CC1 may be separated from the active pattern 130.

A display device according to an example embodiment will now be described with reference to FIG. 17 to FIG. 19 along with the above-described drawings.

The display device according to the present example embodiment may be partially similar to the display device according to the example embodiment shown in FIG. 10 to FIG. 12 described above and, as such, the differences will be mainly described.

In the present example embodiment, the resolution in the second direction DR2 in the second display area BB may be lower than the resolution in the second direction DR2 in the first display area A. Thus, the pitch Wb of the pixel PX or the pixel electrode 191 in the second direction DR2 in the second display area BB may be greater than the pitch Wa of the pixel PX or the pixel electrode 191 in the second direction DR2 in the first display area A, and the pitch Wb may be q times the pitch Wa where q is greater than 1. For example, q may be an integer or non-integer and may be, for example, 2.

The resolution in the first direction DR1 in the second display area BB may be the same as or similar to the resolution in the first direction DR1 in the first display area A. Thus, the pitch of the pixel PX or pixel electrode 191 in the first direction DR1 in the second display area BB may be the same as or similar to the pitch of the pixel PX or the pixel electrode 191 in the first direction DR1 in the first display area A.

The length in the second direction DR2 of the pixel PX disposed in the second display area BB may be greater than the length in the second direction DR2 of the pixel PX disposed in the first display area A, and may be approximately r times thereof where r is greater than 1. For example, r may be an integer or non-integer and may be, for example, about 1.5.

The area on the plane of the pixel electrode 191 disposed in the second display area BB may be greater than the area on the plane of the pixel electrode 191 disposed in the first display area A. The length in the second direction DR2 of the pixel electrode 191 disposed in the second display area BB may be greater than the length in the second direction DR2 of the pixel electrode 191 disposed in the first display area A, and may be approximately s times thereof, where s is greater than 1. For example, s may be integer or non-integer and may be, for example, about 1.5.

In the present example embodiment, s may be less than q. Thus, the interval between two pixel electrodes 191 neighboring in the second direction DR2 in the second display area BB may be greater than the interval between the two pixel electrodes 191 neighboring in the second direction DR2 in the second display area A. Thus, the light transmittance of the second display area BB may be higher than the light transmittance of the first display area A.

Figure 17:
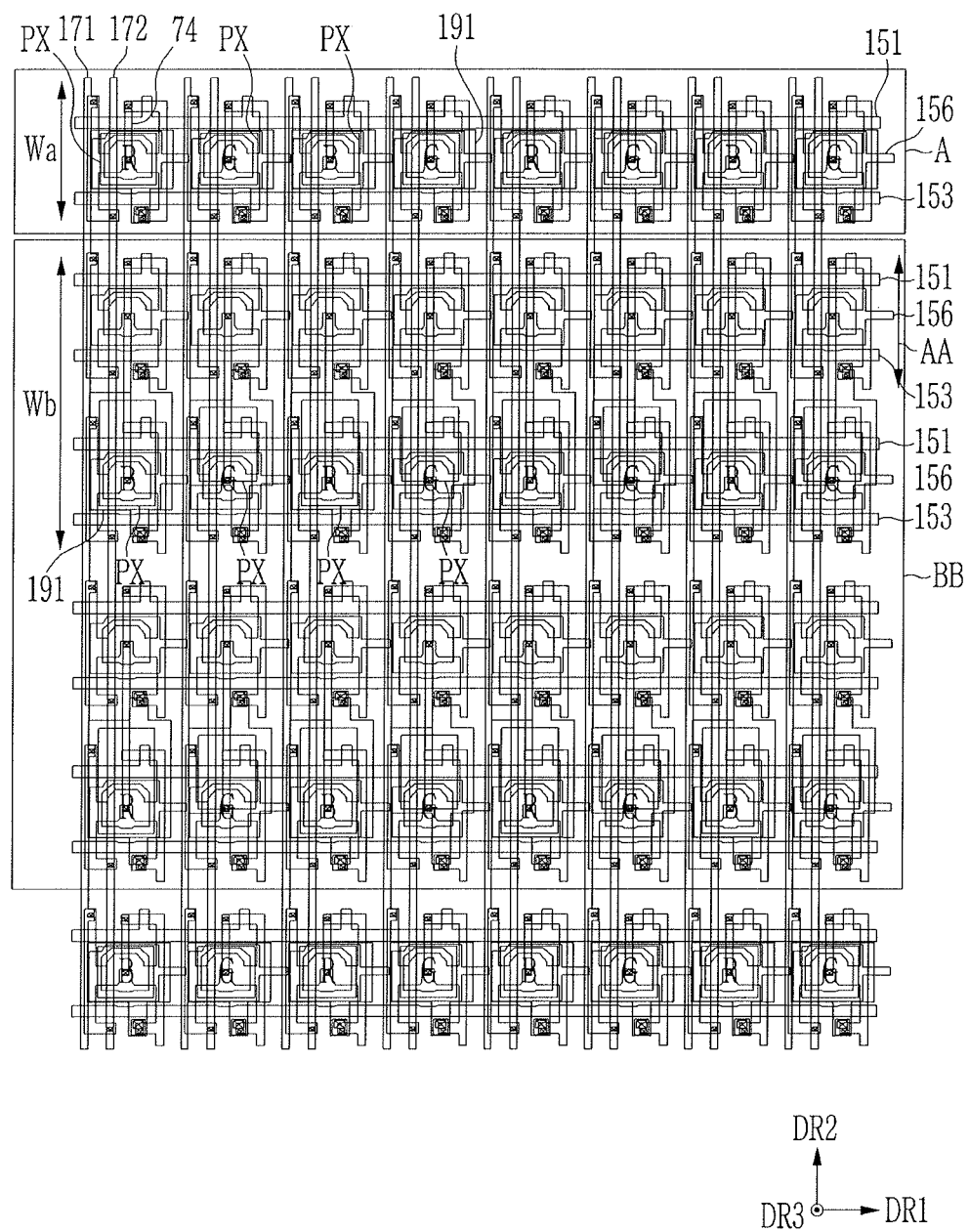
FIG. 17 illustrates a layout view of two display areas of a display device according to an example embodiment.

The structure of the pixel circuit corresponding to one pixel PX disposed in the first display area A of FIG. 17 may be the same as the structure of the pixel circuit shown in FIG. 2 described above.

Figure 18:
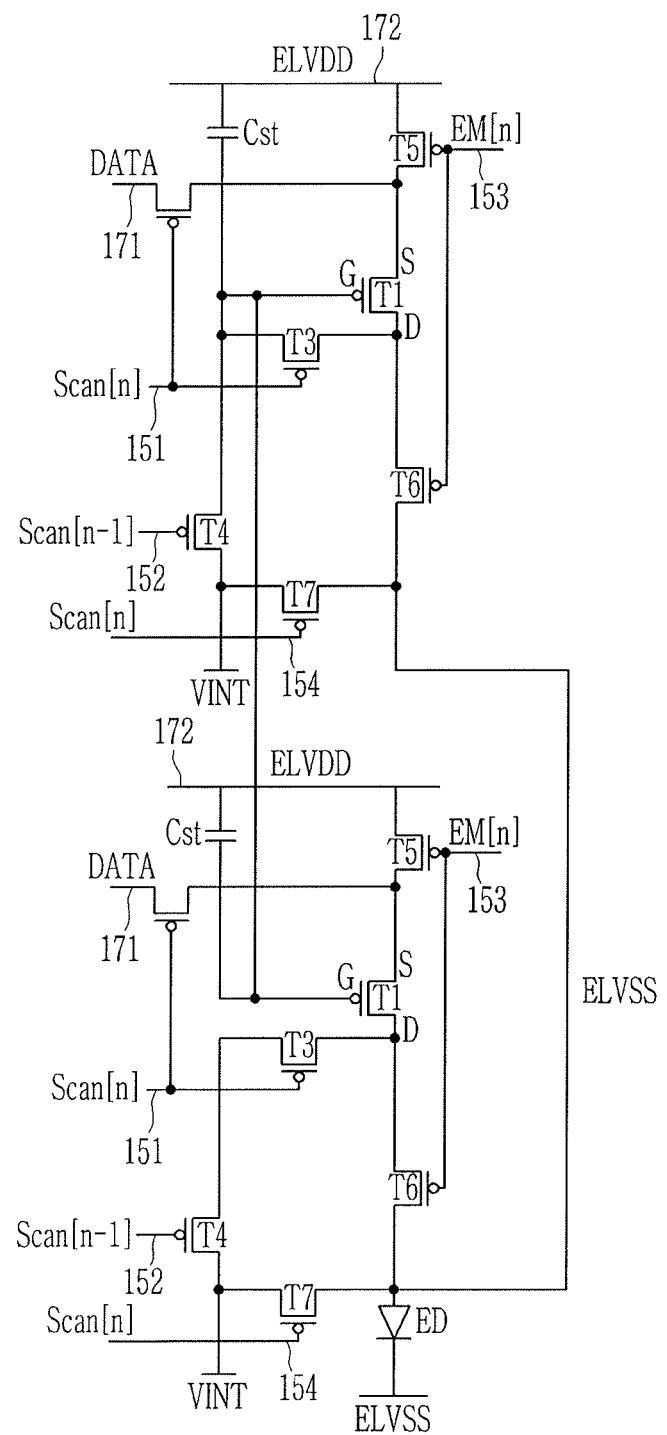
FIG. 18 illustrates a circuit diagram of a pixel circuit disposed in one display area of a display device according to an example embodiment.

FIG. 18 is the circuit diagram of the pixel circuit corresponding to one pixel PX disposed in the second display area BB of FIG. 17.

Referring to FIG. 18, one pixel circuit disposed in the second display area BB may include at least two circuits (referred to as upper and lower circuits in relation to FIG. 18) that are similar to the pixel circuit shown in FIG. 2 described above. The upper and lower circuits having similar structures to each other may be connected to the same data line 171 and the same driving voltage line 172, and each of the upper and lower circuits may be connected to a pair of adjacent scan lines 151, 152, and 154, a pair of adjacent control lines 153, and a pair of adjacent storage lines 156.

The gate electrode G of the first transistor T1 of the upper circuit and the gate electrode G of the first transistor T1 of the lower circuit may be connected to each other. The gate electrode G of the first transistor T1 of the lower circuit may be separated from the third transistor T3 and the fourth transistor T4, unlike in the upper circuit. Therefore, the compensation operation for the data signal DATA transmitted by the data line 171 connected to the lower circuit in the pixel circuit shown in FIG. 18 may not be performed.

The drain electrode of the sixth transistor T6 of the upper circuit and the drain electrode of the sixth transistor T6 of the lower circuit may be connected to each other to be connected to the anode of one light emitting diode (LED) ED. Thus, the pixel circuit of one pixel PX disposed in the second display area BB includes a pair of each of the transistors T1, T2, T3, T4, T5, T6, and T7, but may include one light emitting diode.

A structure of one pixel circuit of the second display area BB of the display device according to an example embodiment will now be described with reference to FIG. 19 along with FIG. 17 and FIG. 18. The same description of the constituent elements as in the preceding example embodiments may be omitted.

In a plan view, a driving gate electrode 155a5 of the upper circuit among two driving gate electrodes 155a5 and 155a6 adjacent in the second direction DR2 is disposed between the scan line 151 and the control line 153 of the upper circuit, and the driving gate electrode 155a6 of the lower circuit may be disposed between the scan line 151 and the control line 153 of the lower circuit. The two driving gate electrodes 155a5 and 155a6 may be connected to each other via one connecting member 74. The connecting member 74 may be electrically connected to the two driving gate electrodes 155a5 and 155a6 through a pair of contact holes 41c and 41d. Thus, the two driving gate electrodes 155a5 and 155a6 may be charged with the same voltage.

One of the two driving gate electrodes 155a5 and 155a6 may be connected to the third transistor T3 through the contact hole 63, while the other may be separated from the third transistor T3.

The active pattern 130 corresponding to each of the two driving gate electrodes 155a5 and 155a6 may overlaps the scan line 151, the control line 153, and each of the driving gate electrodes 155a5 and 155a6 to form the channel region, the source region, and the drain region of the transistors T1, T2, T3, T5, and T6.

Each of the driving gate electrodes 155a5 and 155a6 and each expansion 157 of the storage line 156 overlapping each other may constitute the capacitor Cst.

One pixel electrode 191 corresponding to one pixel circuit may be electrically connected to a pair of connecting members 79 respectively connected to a pair of sixth transistors T6 through the contact holes 89. However, as described above, in the pixel circuit shown in FIG. 18 and FIG. 19, the compensating operation for the data signal DATA transmitted by the data line 171 connected to the lower circuit may not be performed.

One pixel electrode 191 may receive the driving current through a pair of contact holes 89, which may facilitate driving current input.

Figure 19:
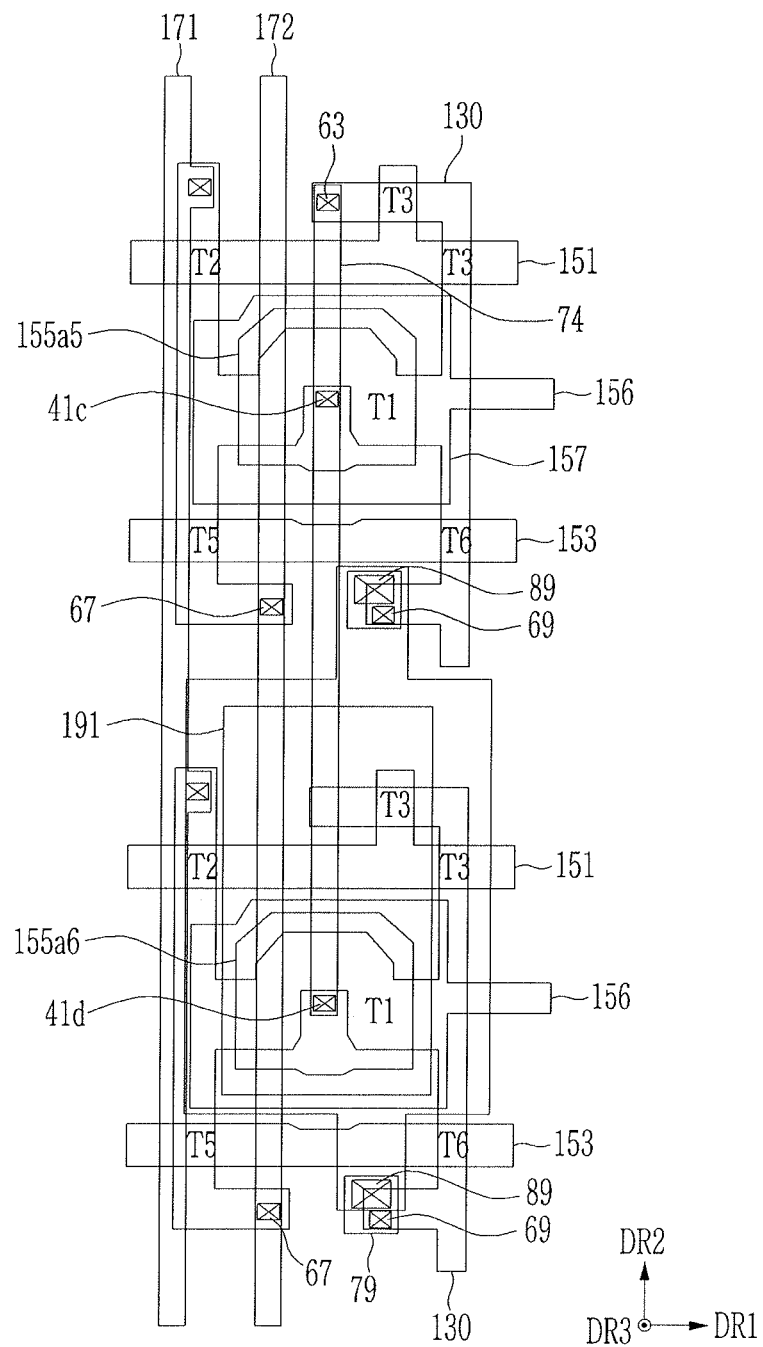
FIG. 19 illustrates a detailed layout view of a pixel circuit of a display device shown in FIG. 17.

In FIG. 19, the second transistor T2 is connected to the data line 171 through the contact hole 62 in the lower circuit as well as the upper circuit. Thus, the active pattern 130 disposed in the lower circuit may be prevented from floating and the display quality may be prevented from deteriorating.

According to the present example embodiment, in the second display area BB, the light emitting diode (LED) ED of one pixel circuit receives the driving current through a pair of first transistors T1 and a pair of sixth transistors T6. Thus, it may be possible to easily input the driving current to the pixel electrode 191 of the second display area BB or to increase the driving current flowing to the pixel electrode 191 so that the luminance difference of the second display area BB with the first display area A may be reduced.

A display device according to an example embodiment will now be described with reference to each of FIG. 20, FIG. 21, FIG. 22, and FIG. 23 along with FIG. 17 to FIG. 19.

Figure 20:
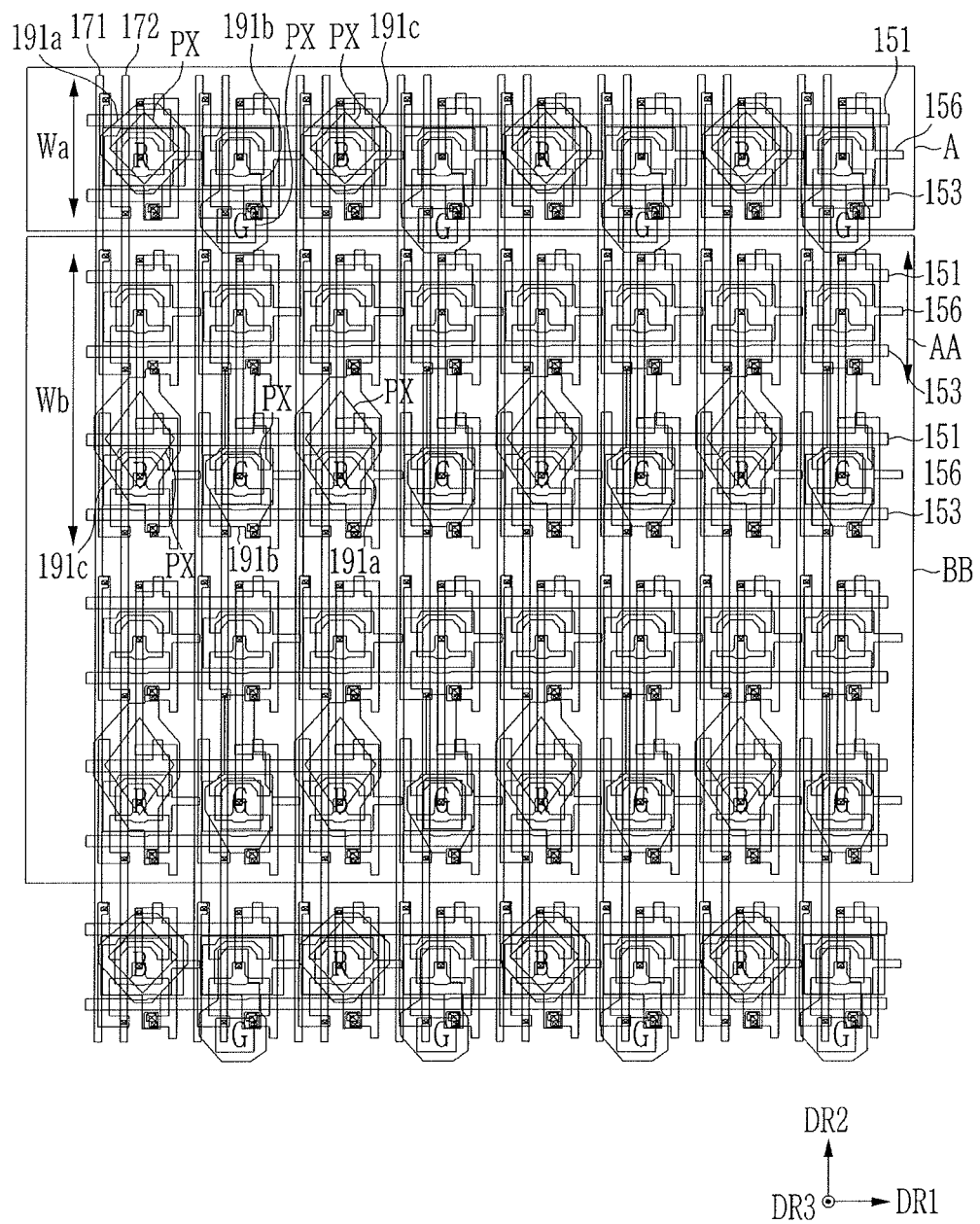
FIG. 20 illustrates a layout view of two display areas of a display device according to an example embodiment.

First, referring to FIG. 20, a display device according to an example embodiment may be the same as most of the display device shown in FIG. 17 to FIG. 19 described above, while the shape and/or the size of the pixel electrode of the first and second display areas A and BB may be different. The shape of the pixel electrode 191 of the red pixel R and the blue pixel B in the first and second display areas A and BB may be roughly rhomboid, and the shape of the green pixel G may be rhomboid or rectangular. In the first and second display areas A and BB, the planar size of the pixel electrode 191b of the green pixel G may be smaller than the planar size of the pixel electrode 191a of the red pixel R and the pixel electrode 191c of the blue pixel B. In addition, the planar size of the pixel electrode 191c of the blue pixel B may be greater than the planar size of the pixel electrode 191a of the red pixel R.

Figure 21:
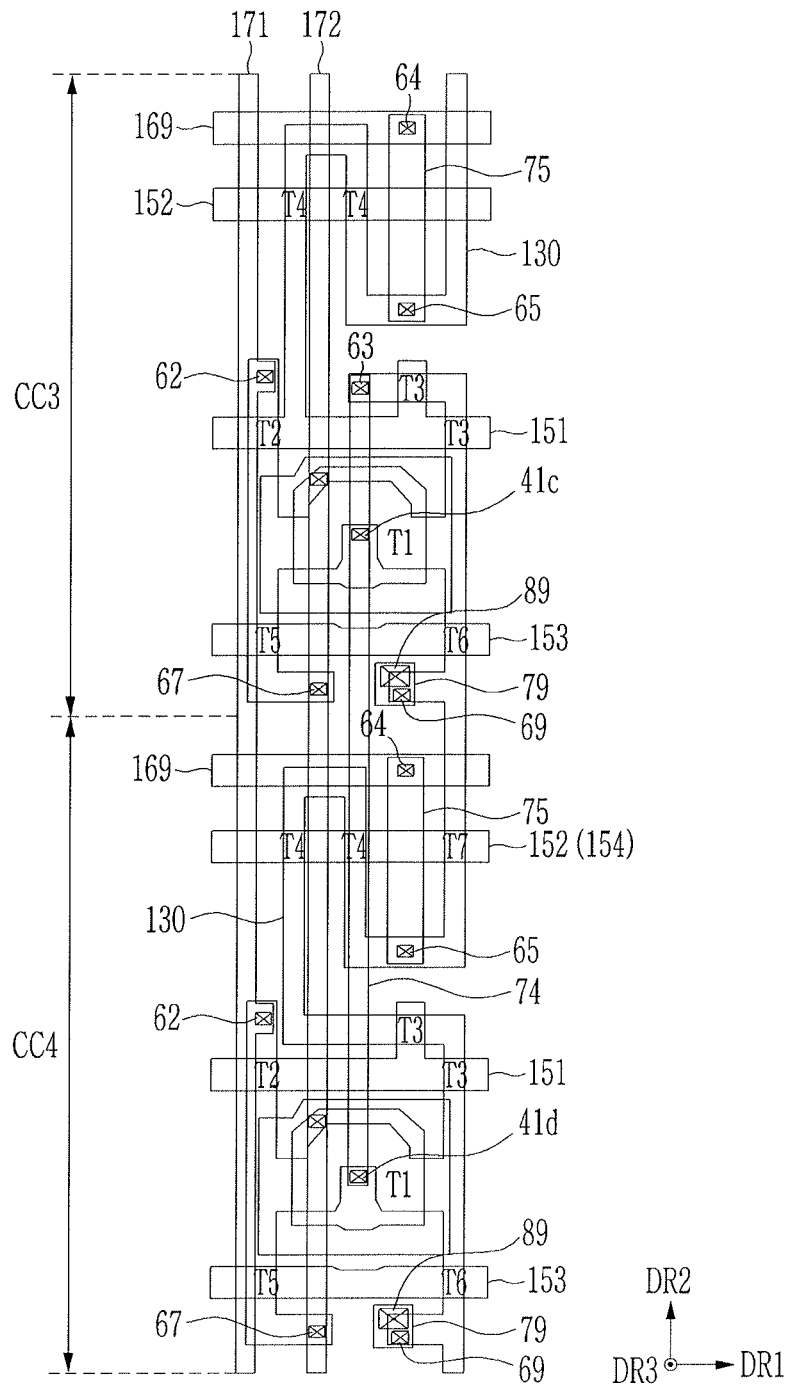
FIG. 21, FIG. 22, and FIG. 23 illustrate detailed layout views of a pixel circuit of a display device shown in FIG. 17, respectively.

Next, referring to FIG. 21, a display device according to an example embodiment may be the same as most of the display device shown in FIG. 19 described above, while the scan line 152, the initialization voltage line 169, and the connecting member 75 that are omitted in FIG. 19 are also shown. The features of the scan line 152, the initialization voltage line 169, and the connecting member 75 may be the same as described above.

The active pattern 130 overlapping the scan line 152 may form the channel region of the above-described fourth transistor T4 and seventh transistor T7. The connecting member 75 may be disposed in the third conductive layer and may electrically connect the initialization voltage line 169 and one conductive region of the active pattern 130, for example the conductive region between the fourth transistor T4 and the seventh transistor T7 through the contact holes 64 and 65.

In the example embodiment shown in FIG. 21, the connecting member 74 may be electrically connected to the third transistor T3 through the contact hole 63 disposed in the upper circuit CC3, but may be separated from the third transistor T3 in the lower circuit CC4.

Both the upper and lower circuits CC3 and CC4, which are included in one pixel circuit, may include each of the transistors T1, T2, T3, T4, T5, T6, and T7.

Figure 22:
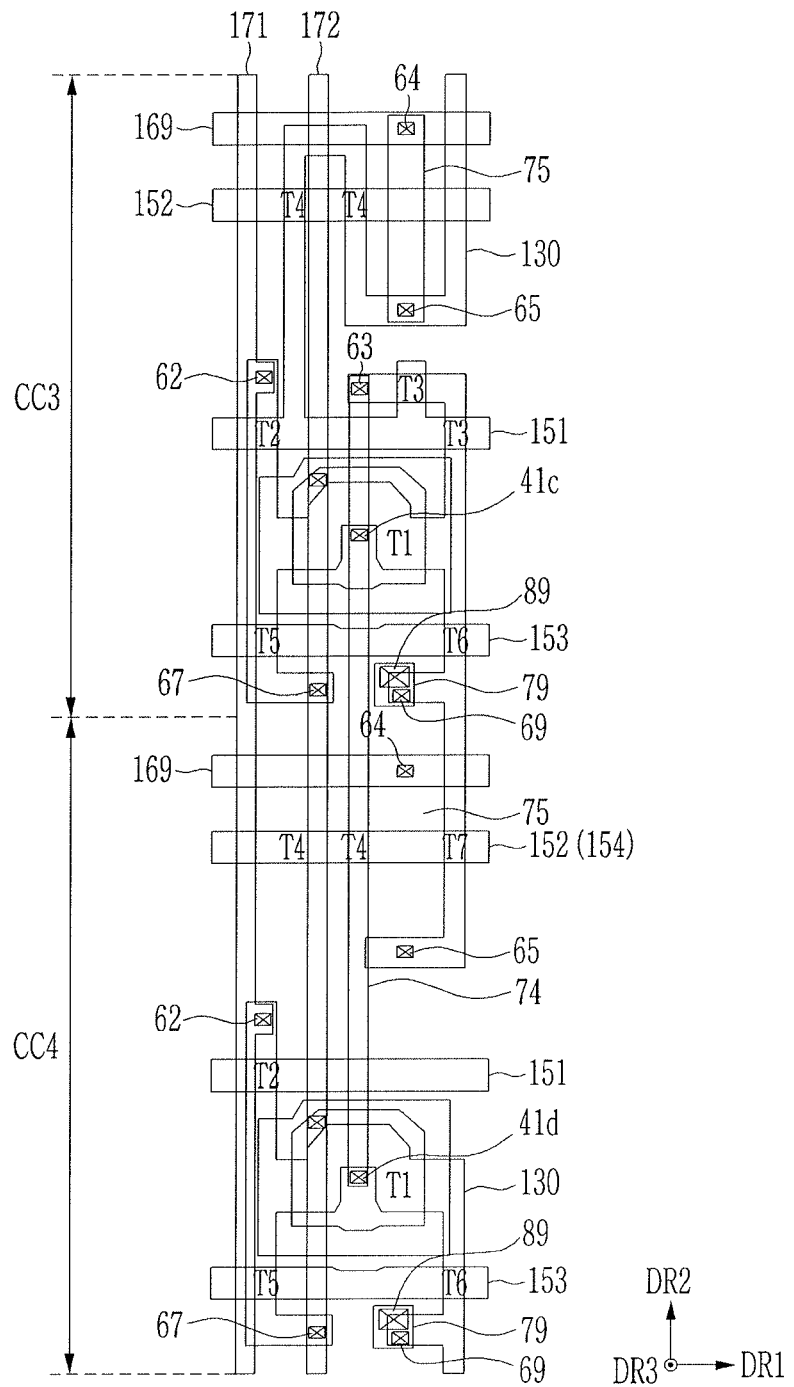

Next, referring to FIG. 22, a display device according to an example embodiment may be the same as most of the display device shown in FIG. 21, while one circuit of the upper circuit CC3 and the lower circuit CC4, for example, the lower circuit CC4, may not include the third transistor T3 and the fourth transistor T4. If the circuit without the connecting member 74 is the upper circuit CC3, the upper circuit CC3 may not include the third transistor T3 and the fourth transistor T4.

Figure 23:
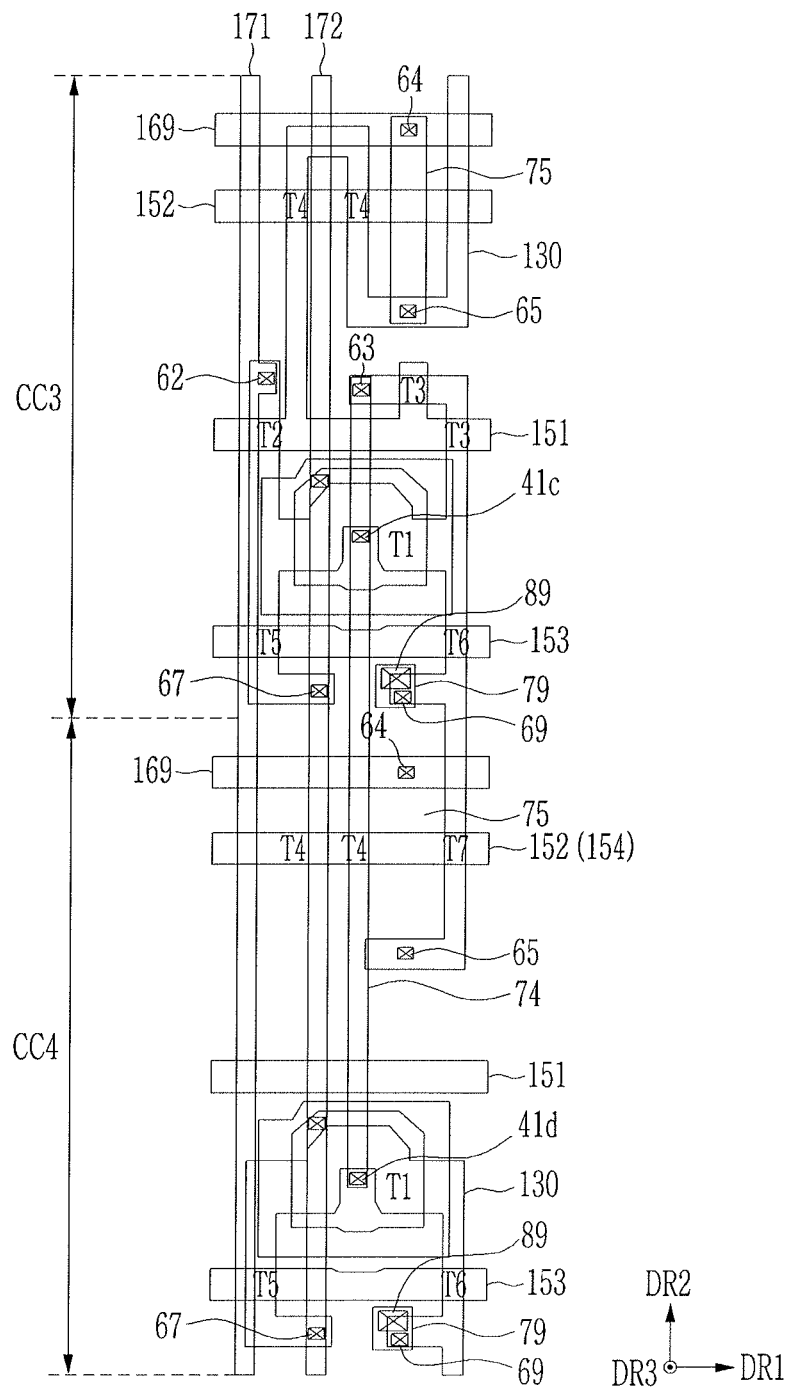

Next, referring to FIG. 23, a display device according to an example embodiment may be the same as most of the display device shown in FIG. 22, while the data line 171 may be separated from the active pattern 130 in the lower circuit CC4 without the contact hole 63. Thus, the lower circuit CC4 may not include the contact hole 62.

By way of summation and review, various display devices having functions other than image display have been developed. As described above, embodiments may provide a display device in which display quality of an image may be improved while differentiating transmittance and/or resolution of a partial region of a display area of the display device from the remaining region. Embodiments may provide a display device having an improved display quality of an image, and differentiating transmittance and/or resolution of a partial region of a display area of the display device from another or remaining region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A display device, comprising:
a first display area including a plurality of first pixel electrodes; and
a second display area including a plurality of second pixel electrodes;

a single first transistor disposed in the first display area,
a pair of first transistors disposed in the second display area, wherein:
a first pitch in a first direction of the plurality of first pixel electrodes in the first display area is smaller than a second pitch in the first direction of the plurality of second pixel electrodes in the second display area, and
a length in the first direction of the first pixel electrodes in the first display area is smaller than a length in the first direction of the second pixel electrodes in the second display area.

2. The display device as claimed in claim 1, further comprising:
a plurality of scan lines, a plurality of data lines for transmitting a data signal, and a plurality of driving voltage lines for transmitting a driving voltage, disposed in the first display area and the second display area;
at least one second transistor connected to the pair of first transistors; and
at least one sixth transistor connected to the pair of first transistors and the second pixel electrode.

3. The display device as claimed in claim 2, wherein:
the pair of first transistors include a pair of driving gate electrodes, and
the pair of driving gate electrodes are electrically connected to each other.

4. The display device as claimed in claim 3, wherein:
the pair of driving gate electrodes are disposed in a same conductive layer as each other and are separated from each other,
a connecting member disposed in a different conductive layer from the pair of driving gate electrodes is electrically connected to the pair of driving gate electrodes.

5. The display device as claimed in claim 3, wherein:
the pair of driving gate electrodes are disposed in a same conductive layer as each other and are connected to each other, and
a connecting member disposed in a different conductive layer from the pair of driving gate electrodes is electrically connected to the pair of driving gate electrodes.

6. The display device as claimed in claim 3, further comprising:
a storage line disposed in a different conductive layer from the pair of driving gate electrodes and transmitting the driving voltage,
wherein each of the plurality of scan lines is extended in a second direction that is different from the first direction, and
the storage line includes an expansion overlapping the pair of driving gate electrodes.

7. The display device as claimed in claim 3, wherein:
the at least one second transistor is a pair of second transistors respectively connected to the pair of first transistors,
the at least one sixth is a pair of sixth transistors respectively connected to the pair of first transistors, and
the second pixel electrode is connected to the pair of sixth transistors.

8. The display device as claimed in claim 7, further comprising:
a connecting member disposed in a different conductive layer from the pair of driving gate electrodes and connected to one of the pair of driving gate electrodes,
wherein each of the plurality of scan lines is extended in the first direction, and
the pair of second transistors are respectively connected to two different data lines among the plurality of data lines.

9. The display device as claimed in claim 7, further comprising:
a connecting member disposed in a different conductive layer from the pair of driving gate electrodes and connected to one of the pair of driving gate electrodes,
wherein each of the plurality of scan lines is extended in the first direction, and
one of the pair of second transistors is connected to one data line among the plurality of data lines and the other is not connected to any among the plurality of data lines.

10. The display device as claimed in claim 7, further comprising:
a connecting member disposed in a different conductive layer from the pair of driving gate electrodes and connected to the pair of driving gate electrodes, and
wherein each of the plurality of scan lines is extended in a second direction that is different from the first direction.

11. The display device as claimed in claim 10, wherein:
the pair of second transistors are connected to a same data line among the plurality of data lines.

12. The display device as claimed in claim 10, wherein:
one of the pair of second transistors is connected to one data line among the plurality of data lines, and the other is not connected to any among the plurality of data lines.

13. The display device as claimed in claim 1, further comprising: a plurality of scan lines, a plurality of data lines for transmitting a data signal; and a plurality of driving voltage lines for transmitting a driving voltage, disposed in the first display area and the second display area, wherein
each of the plurality of scan lines is extended in a second direction that is different from the first direction,
the first display area and the second display area are adjacent to each other in the second direction, and
at least a portion among the plurality of scan lines is bent near a boundary between the first display area and the second display area.

14. A display device, comprising:
a first display area including a plurality of first pixels;
a second display area including a plurality of second pixels;
a plurality of data lines for transmitting a data signal; and
a plurality of driving voltage lines for transmitting a driving voltage, wherein:
a first pitch in a first direction of the plurality of first pixels is smaller than a second pitch in the first direction of the plurality of second pixels, and
a pixel circuit corresponding to the second pixel includes a light-emitting element, a pair of first transistors including a pair of channel regions, at least one second transistor connected to the pair of first transistors and a data line, and at least one sixth connected to the pair of first transistors and the light-emitting element, and
a pixel circuit corresponding to the first pixel includes a single first transistor including a single channel region.

15. The display device as claimed in claim 14, wherein:
the pair of first transistors include a pair of driving gate electrodes, and
the pair of driving gate electrodes are electrically connected to each other.

16. The display device as claimed in claim 15, wherein:
the pair of driving gate electrodes are disposed in a same conductive layer as each other and are separated from each other, and
a connecting member disposed in a different conductive layer from the pair of driving gate electrodes is electrically connected to the pair of driving gate electrodes.

17. The display device as claimed in claim 15, wherein:
the at least one second transistor is a pair of second transistors respectively connected to the pair of first transistors,
the at least one sixth is a pair of sixth transistors respectively connected to the pair of first transistors, and
the light-emitting element is connected to the pair of sixth transistors.

18. The display device as claimed in claim 17, further comprising:
a connecting member disposed in a different conductive layer from the pair of driving gate electrodes and connected to one of the pair of driving gate electrodes,
wherein each of a plurality of scan lines is extended in the first direction, and
the pair of second transistors are respectively connected to two different data lines among the plurality of data lines.

19. The display device as claimed in claim 17, further comprising:
a connecting member disposed in a different conductive layer from the pair of driving gate electrodes and connected to the pair of driving gate electrodes,
wherein each of a plurality of scan lines is extended in a second direction that is different from the first direction.

20. A display device, comprising:
a first display area, the first display area including a plurality of first pixel electrodes; and
a second display area, the second display area including a plurality of second pixel electrodes, wherein
a first pitch in a first direction of the plurality of first pixel electrodes is i times a second pitch in the first direction of the plurality of second pixel electrodes,
a length in the first direction of the first pixel electrodes is j times a length in the first direction of the second pixel electrodes, and
j is smaller than i.

* * * * *